(12) United States Patent
Watabe et al.

(10) Patent No.: US 12,351,742 B2
(45) Date of Patent: Jul. 8, 2025

(54) MATERIAL FOR FORMING ADHESIVE FILM, PATTERNING PROCESS, AND METHOD FOR FORMING ADHESIVE FILM

(71) Applicant: SHIN-ETSU CHEMICAL CO., LTD., Tokyo (JP)

(72) Inventors: Mamoru Watabe, Joetsu (JP); Yuji Harada, Joetsu (JP); Takayoshi Nakahara, Joetsu (JP); Yusuke Biyajima, Joetsu (JP); Tsutomu Ogihara, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 203 days.

(21) Appl. No.: 18/081,100

(22) Filed: Dec. 14, 2022

(65) Prior Publication Data
US 2023/0203354 A1 Jun. 29, 2023

(30) Foreign Application Priority Data

Dec. 23, 2021 (JP) ................................. 2021-209785

(51) Int. Cl.
*C09J 181/00* (2006.01)
*C09J 11/06* (2006.01)
(Continued)

(52) U.S. Cl.
CPC ............ *C09J 181/00* (2013.01); *C09J 11/06* (2013.01); *G03F 7/038* (2013.01); *G03F 7/092* (2013.01);
(Continued)

(58) Field of Classification Search
None
See application file for complete search history.

(56) References Cited

U.S. PATENT DOCUMENTS 9,310,684 B2   4/2016   Meyers et al.
2012/0208127 A1   8/2012   Hatakeyama
(Continued)

FOREIGN PATENT DOCUMENTS

JP   2002-334869 A   11/2002
JP   2004-115630 A   4/2004
(Continued)

OTHER PUBLICATIONS

Sep. 10, 2024 Office Action issued in Japanese Patent Application No. 2021-209785.
(Continued)

*Primary Examiner* — Catherine S Branch
(74) *Attorney, Agent, or Firm* — Oliff PLC

(57) ABSTRACT

A material for forming an adhesive film used for an adhesive film formed directly under a resist upper layer film, contains: (A) a resin having at least one structural unit containing a fluorine-substituted organic sulfonyl anion structure and having at least one structural unit shown by the following general formula (2) besides the structural unit containing the fluorine-substituted organic sulfonyl anion structure; (B) a thermal acid generator; and (C) an organic solvent. The material forms an adhesive film in a fine patterning process by a multilayer resist method in a semiconductor device manufacturing process, where the material gives an adhesive film that has high adhesiveness to a resist upper layer film, has an effect of suppressing fine pattern collapse, and also makes it possible to form an excellent pattern profile. A patterning process uses the material. A method forms the adhesive film.

(Continued)

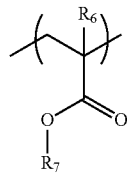

(2)

20 Claims, 2 Drawing Sheets

(51) Int. Cl.
    *G03F 7/038*     (2006.01)
    *G03F 7/09*     (2006.01)
    *G03F 7/20*     (2006.01)
    *G03F 7/36*     (2006.01)

(52) U.S. Cl.
    CPC ............ *G03F 7/094* (2013.01); *G03F 7/2006* (2013.01); *G03F 7/36* (2013.01); *C09J 2301/312* (2020.08); *C09J 2301/408* (2020.08)

(56) References Cited

U.S. PATENT DOCUMENTS

| | | |
|---|---|---|
| 2013/0309606 A1 | 11/2013 | Hatakeyama et al. |
| 2017/0184968 A1 | 6/2017 | Kori et al. |
| 2019/0018512 A1 | 1/2019 | Kim et al. |
| 2020/0142308 A1 | 5/2020 | Dai et al. |
| 2021/0011383 A1 | 1/2021 | Cardineau et al. |
| 2022/0283500 A1 | 9/2022 | Kawaue |

FOREIGN PATENT DOCUMENTS

| | | | |
|---|---|---|---|
| JP | 2008-111103 A | | 5/2008 |
| JP | 2009-126940 A | | 6/2009 |
| JP | 2009-269953 A | | 11/2009 |
| JP | 2011-164345 | * | 8/2011 |
| JP | 2011-164345 | | 8/2011 |
| JP | 2013-253227 A | | 12/2013 |
| JP | 5415982 B2 | | 2/2014 |
| JP | 5582316 B2 | | 9/2014 |
| JP | 5708521 B2 | | 4/2015 |
| JP | 5708522 B2 | | 4/2015 |
| KR | 10-2017-0076585 A | | 7/2017 |
| TW | I522740 B | | 2/2016 |
| TW | I576659 B | | 4/2017 |
| TW | 202124365 A | | 7/2021 |
| WO | 03/017002 A1 | | 2/2003 |
| WO | 2004/066377 A1 | | 8/2004 |
| WO | 2018/143359 A1 | | 8/2018 |
| WO | 2021011367 A1 | | 1/2021 |

OTHER PUBLICATIONS

May 22, 2023 Extended Search Report issued in European Patent Application No. 22214677.1.
Stowers, Jason K. et al., "Directly patterned inorganic hardmask for EUV lithography", Proc. of SPIE, vol. 7969, pp. 796915-1-796915-11, 2011.
Jul. 17, 2023 Office Action and Search Report issued in Taiwanese Patent Application No. 11149096.
May 28, 2024 Office Action issued in Korean Patent Application No. 10-2022-0179828.
Jan. 11, 2025 Office Action issued in Korean Patent Application No. 10-2022-0179828.
Feb. 20, 2025 Office Action issued in European Patent Application No. 22214677.1.

* cited by examiner

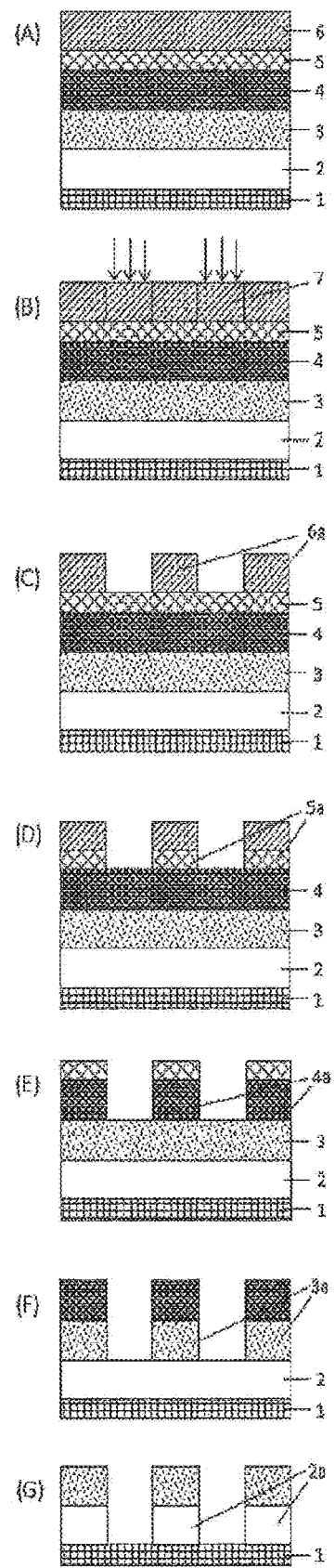
[FIG. 1]

[FIG. 2]
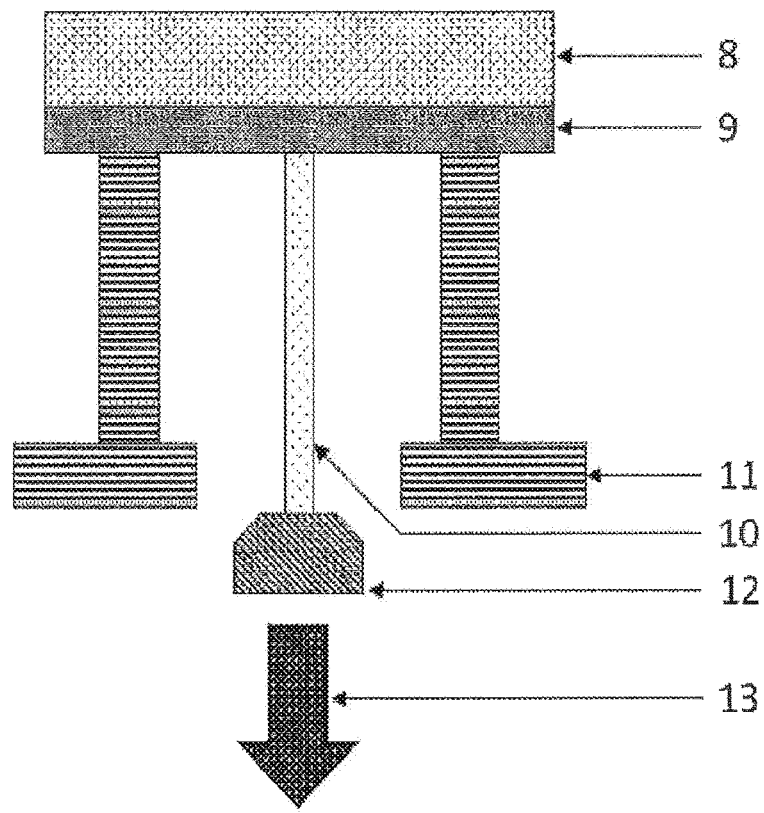

MATERIAL FOR FORMING ADHESIVE FILM, PATTERNING PROCESS, AND METHOD FOR FORMING ADHESIVE FILM

TECHNICAL FIELD

The present invention relates to: a material for forming an adhesive film; a patterning process; and a method for forming an adhesive film.

BACKGROUND ART

As LSI advances toward high integration and high processing speed, miniaturization of pattern size is progressing rapidly. Along with the miniaturization, lithography technology has achieved a fine patterning by shortening the wavelength of a light source and selecting an appropriate resist composition accordingly. The composition mainly used is a positive photoresist composition for monolayer. The monolayer positive photoresist composition not only allows a resist resin to have a skeleton having etching resistance against dry etching with chlorine- or fluorine-based gas plasma, but also provides a resist mechanism that makes an exposed part soluble, thereby dissolving the exposed part to form a pattern and processing a substrate to be processed coated with a photoresist composition by dry etching while using the remaining resist pattern as an etching mask.

However, when the pattern becomes finer, that is, the pattern width is reduced without changing the thickness of the photoresist film to be used, resolution performance of the photoresist film is lowered. In addition, pattern development of the photoresist film with a developer excessively increases a so-called aspect ratio of the pattern, resulting in pattern collapse. Therefore, the film thickness of the photoresist film has been thinned along with the miniaturization.

On the other hand, a substrate to be processed has been generally processed by dry etching while using a pattern-formed photoresist film as an etching mask. In practice, however, there is no dry etching method capable of providing an absolute etching selectivity between the photoresist film and the substrate to be processed. The photoresist film is thus damaged during processing of the substrate to be processed and the photoresist film collapses during processing of the substrate to be processed, so that the resist pattern cannot be transferred accurately to the substrate to be processed. Accordingly, higher dry etching resistance has been required in a photoresist composition accompanying miniaturization of the pattern. In addition, resins used for photoresist compositions have been required to have low absorbance at the wavelength to be used for the exposure owing to the shortening of the exposure wavelength. Accordingly, along with the shift from i-beam to KrF and to ArF, the resin also shifts to novolak resins, polyhydroxystyrene, and resins having an aliphatic polycyclic skeleton. This shift actually accelerates an etching rate under the dry etching conditions, and recent photoresist compositions having high resolution tend to have low etching resistance.

As a result, a substrate to be processed has to be dry-etched with a thinner photoresist film having lower etching resistance. A material for this process and the process itself are urgently needed.

A multilayer resist method is one solution for these problems. This method is as follows: a resist middle layer film having a different etching selectivity from a photoresist film (i.e., a resist upper layer film) is placed between the resist upper layer film and a substrate to be processed; a pattern is formed in the resist upper layer film; then, the pattern is transferred to the resist middle layer film by dry etching while using the resist upper layer film pattern as a dry etching mask; and the pattern is further transferred to the substrate to be processed by dry etching while using the resist middle layer film as a dry etching mask.

One of the multilayer resist methods is a 3-layer resist method, which can be performed with a typical resist composition used in the monolayer resist method. For example, this 3-layer resist method includes the following steps: an organic film containing a novolak or the like is formed as a resist underlayer film on a substrate to be processed; a silicon-containing film is formed thereon as a silicon-containing resist middle layer film; and a usual organic photoresist film is formed thereon as a resist upper layer film. Since the organic resist upper layer film exhibits a favorable etching selectivity ratio relative to the silicon-containing resist middle layer film when dry etching is performed with fluorine-based gas plasma, the resist upper layer film pattern is transferred to the silicon-containing resist middle layer film by dry etching with fluorine-based gas plasma. Furthermore, when etching is performed using oxygen gas or hydrogen gas, the silicon-containing resist middle layer film exhibits a favorable etching selectivity ratio relative to the resist underlayer film, so that the silicon-containing resist middle layer film pattern is transferred to the resist underlayer film by etching with oxygen gas or hydrogen gas. According to this process, even when using a photoresist composition which is difficult to form a pattern in so that the pattern has a sufficient film thickness for directly processing the substrate to be processed or a photoresist composition which does not have sufficient dry etching resistance for processing the substrate, a pattern can be transferred to a silicon-containing film (silicon-containing resist middle layer film). In this manner, it is possible to obtain a pattern of an organic film (resist underlayer film) containing a novolak or the like having a sufficient dry etching resistance for the processing.

In recent years, as an effective technology to take the place of a combination of ArF immersion lithography and multiple exposure process, vacuum ultraviolet ray (EUV) lithography with a wavelength of 13.5 nm is attracting attention. By using this technology, it has become possible to form a fine pattern with a half pitch of 25 nm or less in one exposure.

Meanwhile, in EUV lithography, higher sensitivity in a resist material is strongly required to compensate for insufficient output of a light source. However, increase in shot noise that accompanies higher sensitization leads to increase in edge roughness (LER and LWR) of line patterns, and compatibility of higher sensitization and low edge roughness is given as an important problem in EUV lithography.

As an attempt to achieve higher sensitivity of a resist or to lower the influence of shot noise, it has been considered in recent years to use a metal material in a resist material. A compound that contains a metallic element such as barium, titanium, hafnium, zirconium, or tin has a higher absorbance of EUV light compared to an organic material that does not contain metal, and improvement of photosensitivity of resists and suppression of the influence of shot noise can be expected. Furthermore, a metal-containing resist pattern is expected to achieve a high-selectivity etching process by combining with an underlayer film made from a non-metal material.

For example, a resist material with added metal salt or organometallic complex (Patent Documents 1, 2) or a non-chemically amplified resist material that uses nanoparticles of metal oxide (Patent Document 3, Non Patent Document 1) are considered. However, the resolution of these metal-containing resists have not yet reached the level considered necessary for practical use, and further improvement of resolution is required.

Furthermore, advents of ArF immersion lithography, EUV lithography, and so forth start to realize finer pattern formations. On the other hand, ultrafine patterns have such small areas of contact that the patterns quite easily collapse. Suppressing such pattern collapse is an enormous challenge. Recently, it is regarded that the interaction in the interface between the resist upper layer film and the resist underlayer film in fine patterns has an effect on pattern collapse, and the improvement of the performance of resist underlayer films is also considered necessary.

A material is reported that improves adhesiveness to a resist upper layer film by the use of a resist underlayer film containing a polar functional group such as a lactone structure or a urea structure in order to suppress pattern collapse (Patent Documents 4, 5). However, in the present situation, where the formation of finer patterns is required, these materials cannot be said to have sufficient pattern collapse suppression performance. From the above, a material having higher pattern collapse suppression performance and higher adhesiveness is desired.

CITATION LIST

Patent Literature

Patent Document 1: JP 5708521 B2
Patent Document 2: JP 5708522 B2
Patent Document 3: U.S. Pat. No. 9,310,684 B2
Patent Document 4: WO 2003/017002 A1
Patent Document 5: WO 2018/143359 A1
Patent Document 6: JP 5415982 B2

Non Patent Literature

Non Patent Document 1: Proc. SPIE Vol. 7969, 796915 (2011)

SUMMARY OF INVENTION

Technical Problem

The present invention has been made in view of the above-described circumstances. An object of the present invention is to provide: a material for forming an adhesive film in a fine patterning process by a multilayer resist method in a semiconductor device manufacturing process, where the material gives an adhesive film that has high adhesiveness to a resist upper layer film, has an effect of suppressing fine pattern collapse, and that also makes it possible to form an excellent pattern profile; a patterning process using the material; and a method for forming the adhesive film.

Solution to Problem

To achieve the object, the present invention provides a material for forming an adhesive film used for an adhesive film formed directly under a resist upper layer film, the material for forming an adhesive film comprising: (A) a resin having at least one structural unit containing a fluorine-substituted organic sulfonyl anion structure and having at least one structural unit shown by the following general formula (2) besides the structural unit containing the fluorine-substituted organic sulfonyl anion structure; (B) a thermal acid generator; and (C) an organic solvent,

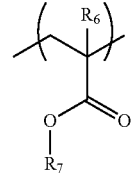

(2)

wherein $R_6$ represents a hydrogen atom or a methyl group and $R_7$ represents a group selected from the following formulae (2-1) to (2-3),

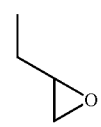

(2-1)

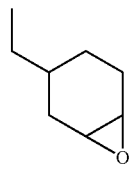

(2-2)

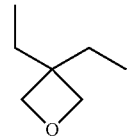

(2-3)

wherein a broken line represents an attachment point.

Using such a material for forming an adhesive film, it is possible to form an adhesive film that has high adhesiveness to a resist upper layer film, has an effect of suppressing fine pattern collapse, and also gives a favorable pattern profile.

Furthermore, in the present invention, the fluorine-substituted organic sulfonyl anion structure is preferably a structure shown by the following general formula (1),

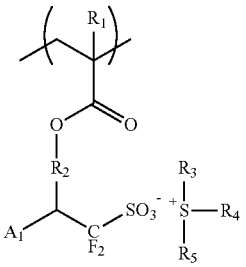

(1)

wherein $R_1$ represents a hydrogen atom or a methyl group, $R_2$ represents a single bond, $-Z^{21}-C(=O)-O-$, $-Z^{21}-O-$, or $-Z^{21}-O-C(=O)-$, $Z^{21}$ represents a saturated hydrocarbylene group having 1 to 12 carbon atoms and optionally containing a carbonyl group, an ester bond, or an ether bond, $R_3$ to $R_5$ each independently represent a hydrocarbyl group having 1 to 21 carbon atoms and optionally containing a heteroatom, any two of $R_3$, $R_4$, and $R_5$ optionally bonding with each other to form a ring together with a sulfur atom bonded therewith, and $A_1$ represents a hydrogen atom or a trifluoromethyl group.

Furthermore, in the present invention, the $R_2$ in the general formula (1) more preferably contains a divalent organic group having an alicyclic structure.

Using such a material for forming an adhesive film, it is possible to form an adhesive film that has higher adhesiveness to a resist upper layer film, has a higher effect of suppressing fine pattern collapse, and also gives a better pattern profile.

Furthermore, in the present invention, the organic solvent (C) is preferably a mixture of one or more kinds of organic solvent having a boiling point of lower than 150° C. and one or more kinds of organic solvent having a boiling point of 150° C. or higher and lower than 220° C.

Such a material for forming an adhesive film has excellent film-formability, and has sufficient solvent solubility, so that the generation of coating defects can be suppressed.

Furthermore, in the present invention, the resin (A) preferably has a weight-average molecular weight of 5,000 to 70,000.

A material for forming an adhesive film containing a resin having a weight-average molecular weight within such a range has excellent film-formability. In addition, the generation of a sublimation product during heat-curing can be suppressed and the contamination of apparatuses due to sublimation products can be suppressed.

Furthermore, the present invention preferably further comprises at least one out of (D) a photo-acid generator, (E) a surfactant, (F) a crosslinking agent, and (G) a plasticizer.

It is possible to make fine adjustments to performance according to customer requirements, for example, film-formability, filling property, optical characteristics, and reduction of sublimation products by the presence, absence, or choice of these additives, and this is favorable for practicality.

Furthermore, in the present invention, the resist upper layer film has preferably been formed using a negative resist composition.

Furthermore, in the present invention, the resist upper layer film has more preferably been formed using a resist upper layer film material containing at least an organic metal compound and a solvent.

Furthermore, the organic metal compound more preferably contains at least one selected from titanium, cobalt, copper, zinc, zirconium, lead, indium, tin, antimony, and hafnium.

Such a material for forming an adhesive film has an effect of suppressing fine pattern collapse and allows an appropriate adjustment of pattern profile, exposure sensitivity, and so forth of a resist upper layer film. In addition, it is possible to prevent the contamination of the substrate to be processed due to the metal compound when using a resist upper layer film material containing an organic metal compound and a solvent.

In addition, the present invention provides a patterning process for forming a pattern in a substrate to be processed, comprising the steps of:

(I-1) applying the above-described material for forming an adhesive film on the substrate to be processed and then performing a heat treatment to form an adhesive film;

(I-2) forming a resist upper layer film on the adhesive film by using a photoresist material;

(I-3) subjecting the resist upper layer film to pattern exposure and then to development with a developer to form a circuit pattern in the resist upper layer film;

(I-4) transferring the pattern to the adhesive film by dry etching while using the resist upper layer film having the formed circuit pattern as a mask; and (I-5) forming the pattern in the substrate to be processed by processing the substrate to be processed while using the adhesive film having the transferred pattern as a mask.

In addition, the present invention provides a patterning process for forming a pattern in a substrate to be processed, comprising the steps of:

(II-1) forming a resist underlayer film on the substrate to be processed;

(II-2) forming a silicon-containing resist middle layer film on the resist underlayer film;

(II-3) applying the above-described material for forming an adhesive film on the silicon-containing resist middle layer film and then performing a heat treatment to form an adhesive film;

(II-4) forming a resist upper layer film on the adhesive film by using a photoresist material;

(II-5) subjecting the resist upper layer film to pattern exposure and then to development with a developer to form a circuit pattern in the resist upper layer film;

(II-6) transferring the pattern to the adhesive film by dry etching while using the resist upper layer film having the formed circuit pattern as a mask;

(II-7) transferring the pattern to the silicon-containing resist middle layer film by dry etching while using the adhesive film having the formed pattern as a mask;

(II-8) transferring the pattern to the resist underlayer film by dry etching while using the silicon-containing resist middle layer film having the transferred pattern as a mask; and (II-9) forming the pattern in the substrate to be processed by processing the substrate to be processed while using the resist underlayer film having the transferred pattern as a mask.

In addition, the present invention provides a patterning process for forming a pattern in a substrate to be processed, comprising the steps of:

(III-1) forming a resist underlayer film on the substrate to be processed;

(III-2) forming an inorganic hard mask middle layer film selected from a silicon oxide film, a silicon nitride film, and a silicon oxynitride film on the resist underlayer film;

(III-3) applying the above-described material for forming an adhesive film on the inorganic hard mask middle layer film and then performing a heat treatment to form an adhesive film;

(III-4) forming a resist upper layer film on the adhesive film by using a photoresist material;

(III-5) subjecting the resist upper layer film to pattern exposure and then to development with a developer to form a circuit pattern in the resist upper layer film;

(III-6) transferring the pattern to the adhesive film by dry etching while using the resist upper layer film having the formed circuit pattern as a mask;

(III-7) transferring the pattern to the inorganic hard mask middle layer film by dry etching while using the adhesive film having the formed pattern as a mask;

(III-8) transferring the pattern to the resist underlayer film by dry etching while using the inorganic hard mask middle layer film having the transferred pattern as a mask; and (III-9) forming the pattern in the substrate to be processed by processing the substrate to be processed while using the resist underlayer film having the transferred pattern as a mask.

As described, the inventive material for forming an adhesive film can be used suitably for various patterning processes such as a 2-layer resist process or a 4-layer resist process in which the adhesive film is formed on the silicon-containing middle layer film (silicon-containing resist middle layer film, inorganic hard mask middle layer film). According to these patterning processes, pattern collapse can be relieved effectively by the formation of the adhesive film, and these patterning processes are suitable for photolithography of a resist upper layer film.

In this event, the inorganic hard mask middle layer film is preferably formed by a CVD method or an ALD method.

Furthermore, in the present invention, photolithography at a wavelength of 10 nm or more to 300 nm or less, a direct drawing by electron beam, a nanoimprinting, or a combination thereof is preferably employed as a method for forming a circuit pattern in the resist upper layer film.

Furthermore, in the present invention, alkaline development or development with an organic solvent is preferably employed as a development method.

In the present invention, pattern formation can be performed favorably and efficiently according to such a patterning process.

Furthermore, in the present invention, the substrate to be processed is preferably a semiconductor device substrate or the semiconductor device substrate coated with any of a metal film, a metal carbide film, a metal oxide film, a metal nitride film, a metal oxycarbide film, and a metal oxynitride film.

In this event, as the metal, silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof is preferably used.

According to the inventive patterning processes, the substrates to be processed described above can be processed in the above manner to form a pattern.

In addition, the present invention provides a method for forming an adhesive film that functions as an adhesive layer employed in a semiconductor device manufacturing process, the method comprising:

spin-coating a substrate to be processed with the above-described material for forming an adhesive film; and heating the substrate coated with the material for forming an adhesive film at a temperature of 100° C. or higher to 300° C. or lower for 10 to 600 seconds to form a cured film.

In addition, the present invention provides a method for forming an adhesive film that functions as an adhesive layer employed in a semiconductor device manufacturing process, the method comprising:

spin-coating a substrate to be processed with the above-described material for forming an adhesive film; and heating the substrate coated with the material for forming an adhesive film in an atmosphere having an oxygen concentration of 0.1% or more to 21% or less to form a cured film.

According to such methods, the crosslinking reaction during formation of the adhesive film can be promoted, so that mixing with the resist upper layer film can be more highly suppressed. Furthermore, by adjusting the heating temperature, time, and oxygen concentration appropriately within the above-described ranges, an effect of suppressing pattern collapse of the adhesive film suited to the usage can be provided, and in addition, pattern profile adjustment properties of the resist upper layer film can be achieved.

In addition, the present invention provides a method for forming an adhesive film that functions as an adhesive layer employed in a semiconductor device manufacturing process, the method comprising:

spin-coating a substrate to be processed with the above-described material for forming an adhesive film; and heating the substrate coated with the material for forming an adhesive film in an atmosphere having an oxygen concentration of less than 0.1% to form a cured film.

According to such a method, the substrate to be processed is not degraded, the crosslinking reaction during formation of the adhesive film can be promoted, and intermixing with the upper layer film can be suppressed more highly even when the substrate to be processed contains a material that is unstable to heating under an oxygen atmosphere. Therefore, such a method is useful.

Advantageous Effects of Invention

As described above, according to the present invention, it is possible to provide a material for forming an adhesive film having high adhesiveness to a resist upper layer film and having an effect of suppressing fine pattern collapse. Moreover, this material for forming an adhesive film has high adhesiveness and has an effect of suppressing fine pattern collapse, and also makes it possible to make appropriate adjustments to the pattern profile, exposure sensitivity, and so forth of the resist upper layer film. Therefore, the material is extremely useful in multilayer resist processes, for example, a 4-layer resist process in which the adhesive film is formed on a silicon-containing middle layer film. In addition, according to the inventive method for forming an adhesive film, it is possible to form an adhesive film that cures sufficiently on a substrate to be processed and has high adhesiveness to a resist upper layer film. In addition, according to the inventive patterning process, a fine pattern can be formed in a substrate to be processed with high precision in a multilayer resist process.

BRIEF DESCRIPTION OF DRAWINGS

FIG. 1 is an explanatory diagram of an example of an inventive patterning process according to a 4-layer resist process.

FIG. 2 is an explanatory diagram showing a method for measuring the adhesiveness in Examples.

DESCRIPTION OF EMBODIMENTS

In the present description, when an element is described as being "directly under" another element, the element contacts the other element directly, and there is no intervening element. On the contrary, when an element is described as being "under" another element, there may be an intervening element between the elements. Similarly, when an element is described as being "directly on" another element, the element contacts the other element directly, and there is no intervening element. When an element is described as being "on" another element, there may be an intervening element between the elements.

As described above, there have been demands for: a material for forming an adhesive film that has high adhesiveness to a resist upper layer film and has an effect of suppressing fine pattern collapse in a fine patterning process according to a multilayer resist method in a semiconductor device manufacturing process; a patterning process using the material; and a method for forming an adhesive film.

It has been revealed previously that a resist underlayer film material containing a resin that has, as a repeating unit, a (meth)acrylate that generates an α-fluorosulfonic acid bonded to the main chain by light and/or heat is effective for improvement of resist pattern profile and adhesiveness to a resist (Patent Document 6). In this invention, an α-fluorosulfonic acid derived from a resist underlayer film is present at the lowermost part of the resist film, and it is asserted that this prevents deactivation of acid in the film, so that it is possible to prevent trailing and scum in space portions after development. However, examples of application of this invention are limited to positive resists, and in particular, no advantages in negative resists have been revealed.

In a pattern obtained by negative development (hereinafter, referred to as a negative pattern), comparing a photoresist film before exposure and the film quality of a negative pattern after exposure, acid-labile groups in the negative pattern are detached due to acid generated by the exposure, and the amount of hydrophilic groups such as carboxy groups and phenolic hydroxy groups increases.

Accordingly, the present inventors have considered that it is possible to develop, by using a resin that generates a sulfonic acid bonded to the main chain, an adhesive film in which the sulfonic acid forms a hydrogen bond with the carboxy groups and the phenolic hydroxy groups, the adhesive film being particularly excellent in adhesiveness to a negative pattern. The present inventors have earnestly studied and have found out that a material for forming an adhesive film having, as a main component, a compound having a certain structure, a patterning process using the material, and a method for forming an adhesive film are extremely effective, and completed the present invention.

That is, the present invention is a material for forming an adhesive film used for an adhesive film formed directly under a resist upper layer film, the material for forming an adhesive film comprising: (A) a resin having at least one structural unit containing a fluorine-substituted organic sulfonyl anion structure and having at least one structural unit shown by the following general formula (2) besides the structural unit containing the fluorine-substituted organic sulfonyl anion structure; (B) a thermal acid generator; and (C) an organic solvent,

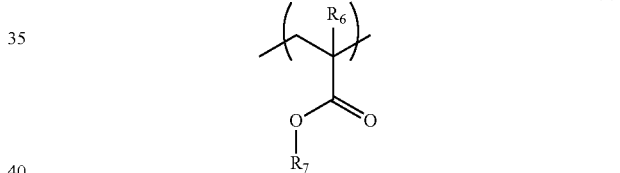

(2)

wherein $R_6$ represents a hydrogen atom or a methyl group and $R_7$ represents a group selected from the following formulae (2-1) to (2-3),

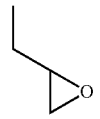

(2-1)

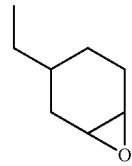

(2-2)

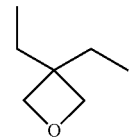

(2-3)

wherein a broken line represents an attachment point.

Hereinafter, the present invention will be described in detail. However, the present invention is not limited thereto.

[Material for Forming Adhesive Film]

The present invention provides a material for forming an adhesive film used for an adhesive film formed directly under a resist upper layer film, the material for forming an adhesive film containing: (A) a resin having at least one structural unit containing a fluorine-substituted organic sulfonyl anion structure and having at least one structural unit shown by the following general formula (2) besides the structural unit containing the fluorine-substituted organic sulfonyl anion structure; (B) a thermal acid generator; and (C) an organic solvent.

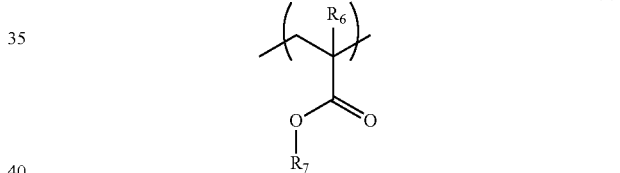

(2)

In the general formula (2), $R_6$ represents a hydrogen atom or a methyl group and $R_7$ represents a group selected from the following formulae (2-1) to (2-3).

(2-1)

(2-2)

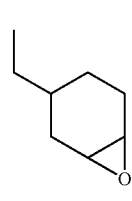

(2-3)

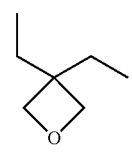

In the formulae, a broken line represents an attachment point.

Note that in the inventive material for forming an adhesive film, one kind of the resin (A) may be used, or two or more kinds thereof may be used in combination. Furthermore, the material for forming an adhesive film may contain components other than the components (A) to (C). In the following, each component will be described.

[(A) Resin]

The resin (A) contained in the inventive material for forming an adhesive film has at least one structural unit containing a fluorine-substituted organic sulfonyl anion structure and has at least one structural unit shown by the following general formula (2) besides the structural unit containing the fluorine-substituted organic sulfonyl anion structure.

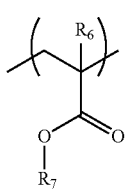
(2)

In the general formula (2), $R_6$ represents a hydrogen atom or a methyl group and $R_7$ represents a group selected from the following formulae (2-1) to (2-3).

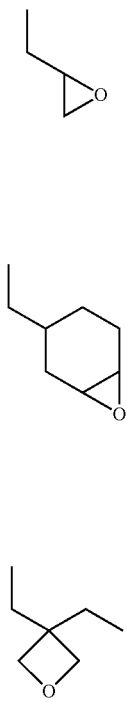
(2-1)

(2-2)

(2-3)

In the formulae, a broken line represents an attachment point.

The fluorine-substituted organic sulfonyl anion structure is preferably a structure shown by the following general formula (1), but is not limited thereto.

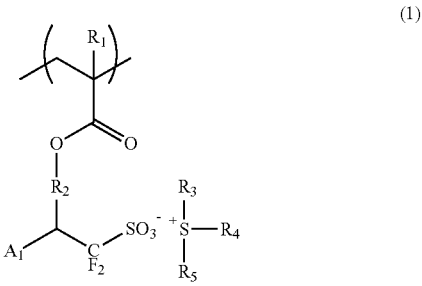
(1)

In the formula, $R_1$ represents a hydrogen atom or a methyl group, $R_2$ represents a single bond, $-Z^{21}-C(=O)-O-$, $-Z^{21}-O-$, or $-Z^{21}-O-C(=O)-$, $Z^{21}$ represents a saturated hydrocarbylene group having 1 to 12 carbon atoms and optionally containing a carbonyl group, an ester bond, or an ether bond, $R_3$ to $R_5$ each independently represent a hydrocarbyl group having 1 to 21 carbon atoms and optionally containing a heteroatom, any two of $R_3$, $R_4$, and $R_5$ optionally bonding with each other to form a ring together with a sulfur atom bonded therewith, and $A_1$ represents a hydrogen atom or a trifluoromethyl group.

When the $R_2$ in the general formula (1) represents $-Z^{21}-C(=O)-O-$, $-Z^{21}-O-$, or $-Z^{21}-O-C(=O)-$, specific examples of the saturated hydrocarbylene group having 1 to 12 carbon atoms and optionally containing a carbonyl group, an ester bond, or an ether bond represented by $Z^{21}$ include the following, but are not limited thereto.

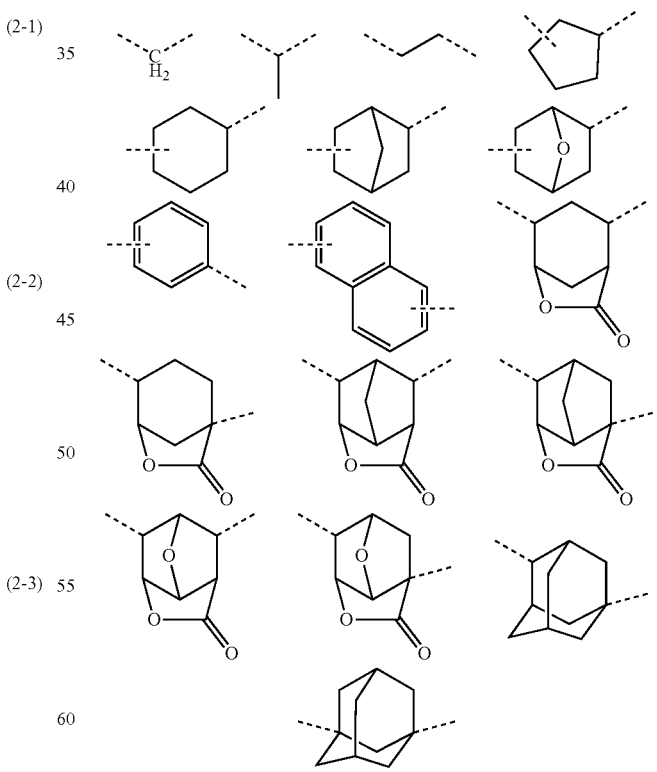

In the formulae, a broken line represents an attachment point.

The $R_2$ in the general formula (1) preferably contains a divalent organic group having an alicyclic structure.

The structural unit shown by the general formula (1) functions as an acid-generating group. A sulfonic acid is generated from this structural unit, and the sulfonic acid forms a hydrogen bond with the pattern. Thus, adhesiveness to the resist is improved. Moreover, since the generated acid is bonded to the polymer main chain, it is possible to prevent the degradation of pattern roughness and so forth of the resist upper layer film due to excessive diffusion of acid.

Specific examples of anions of monomers that give the general formula (1) include the following, but are not limited thereto. In the following formulae, $R_1$ is as defined above.

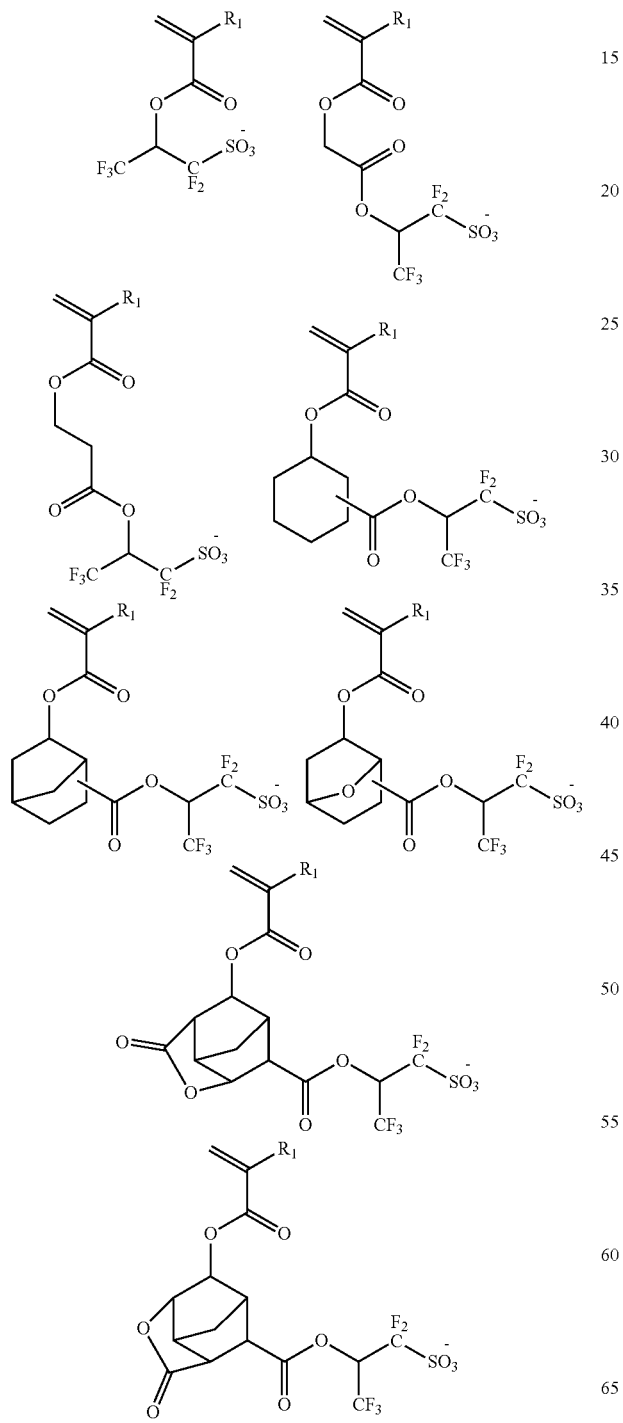

-continued

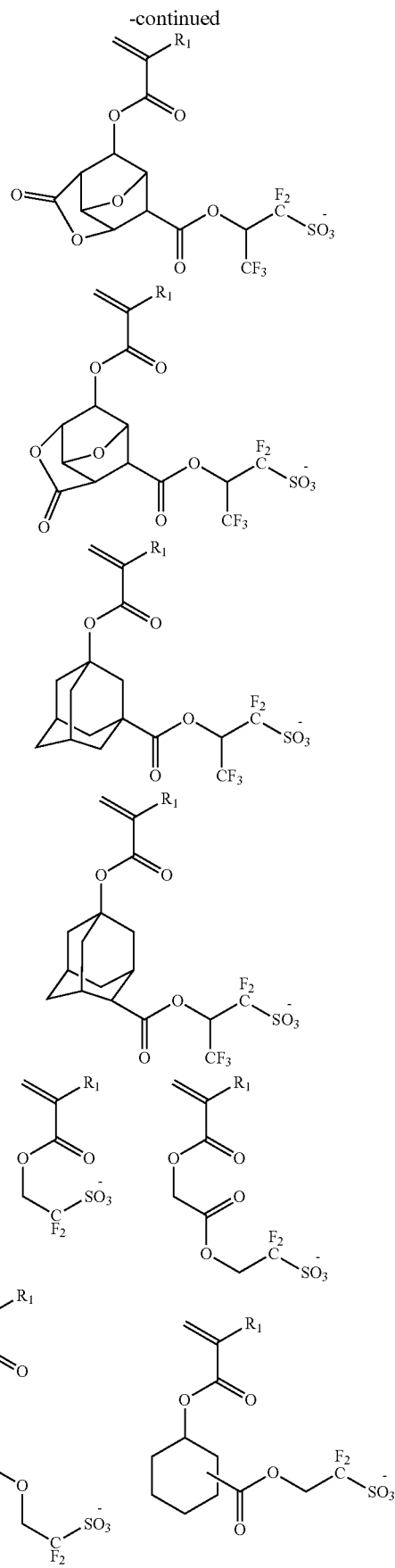

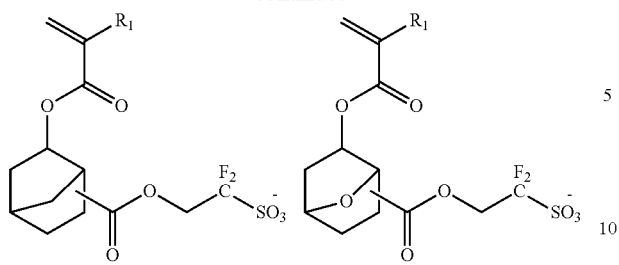

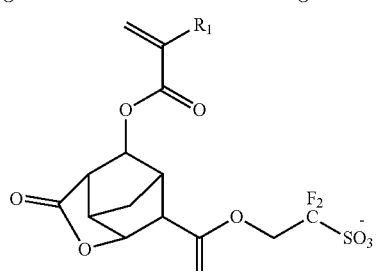

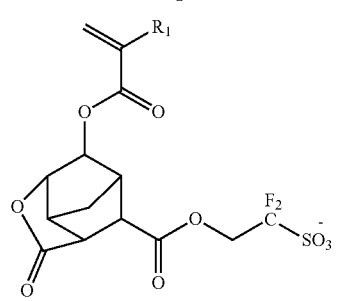

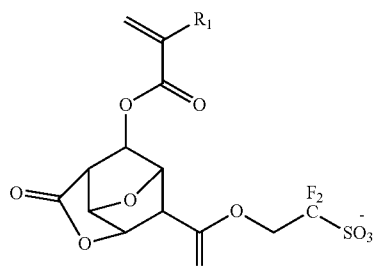

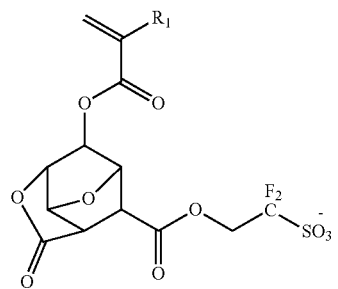

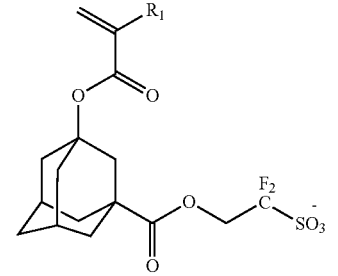

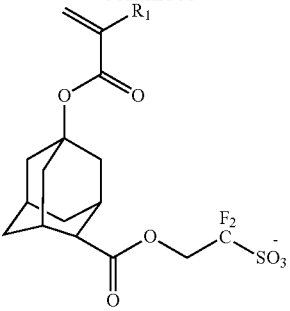

Examples of cations of monomers that give the general formula (1) include triphenylsulfonium, 4-hydroxyphenyldiphenylsulfonium, bis(4-hydroxyphenyl)phenylsulfonium, tris(4-hydroxyphenyl)sulfonium, 4-tert-butoxyphenyldiphenylsulfonium, bis(4-tert-butoxyphenyl)phenylsulfonium, tris(4-tert-butoxyphenyl)sulfonium, 3-tert-butoxyphenyldiphenylsulfonium, bis(3-tert-butoxyphenyl)phenylsulfonium, tris(3-tert-butoxyphenyl)sulfonium, 3,4-di-tert-butoxyphenyldiphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, 4-tert-butoxycarbonylmethyloxyphenyldiphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, (4-hydroxy-3,5-dimethylphenyl)diphenylsulfonium, (4-n-hexyloxy-3,5-dimethylphenyl)diphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, diphenyl-2-thienylsulfonium, 4-n-butoxynaphthyl-1-thiacyclopentanium, 2-n-butoxynaphthyl-1-thiacyclopentanium, 4-methoxynaphthyl-1-thiacyclopentanium, 2-methoxynaphthyl-1-thiacyclopentanium, and the like. More preferable examples include triphenylsulfonium, 4-tert-butylphenyldiphenylsulfonium, 4-tert-butoxyphenyldiphenylsulfonium, tris (4-tert-butylphenyl) sulfonium, tris (4-tert-butoxyphenyl) sulfonium, dimethylphenylsulfonium, and the like. Further examples also include those shown by the following structures, but are not limited thereto.

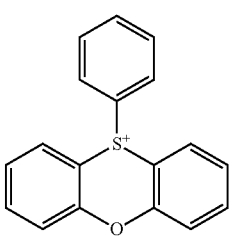 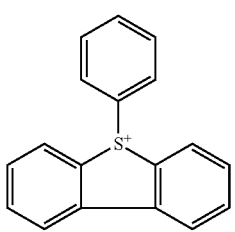

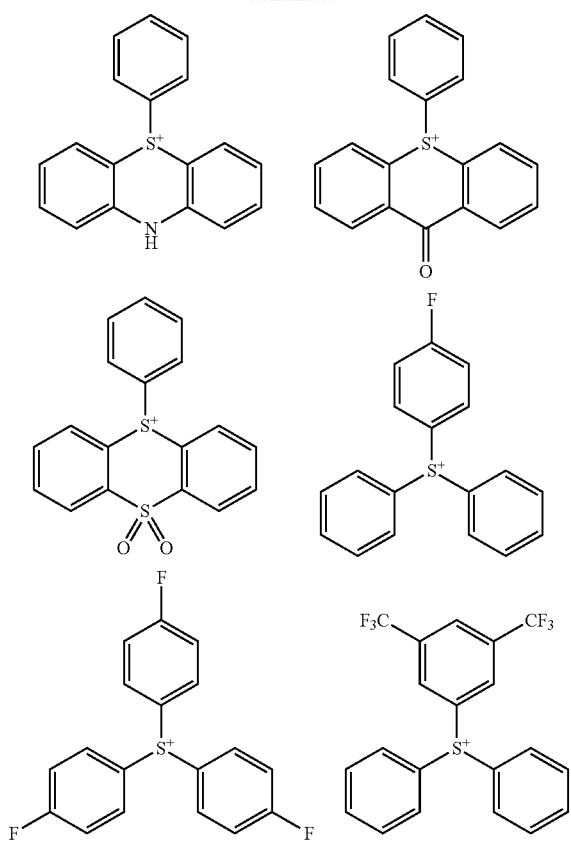
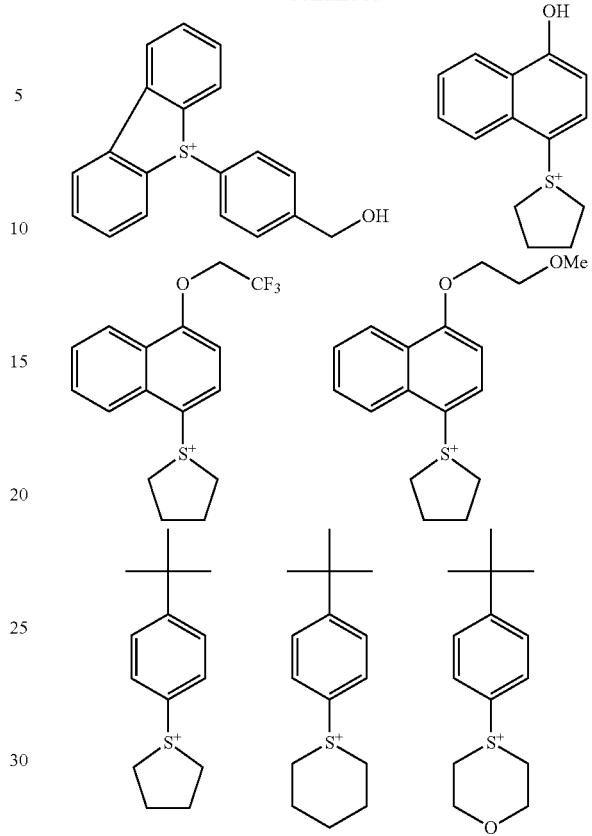
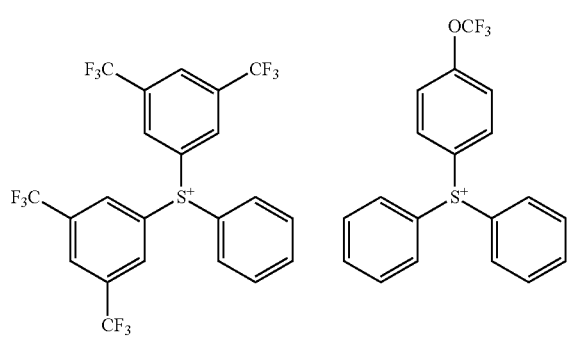

The structural unit shown by the general formula (2) can provide curability owing to the interaction of hydroxy groups which are generated by a ring opening reaction that occurs during curing of an epoxy or oxetane structure and which function as crosslinking groups without losing the adhesiveness to the resist upper layer film and the substrate to be processed or the silicon-containing middle layer film.

Furthermore, specific examples of the structural unit shown by the general formula (2) include the following. $R_6$ is as defined above.

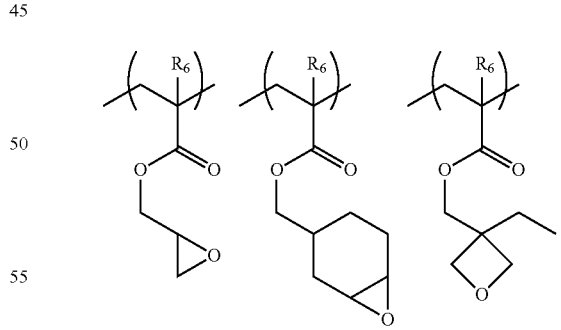

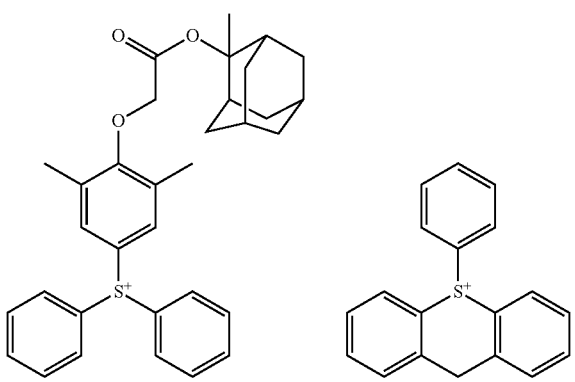

In addition, the resin (A) contained in the inventive material for forming an adhesive film preferably has, in the structural unit thereof, the structural units shown by the general formulae (1) and (2), and one or more kinds of each of the structural units shown by the general formula (1) or (2) can be used in combination.

By combining a plurality of structural units, not only is adhesiveness enhanced and the effect of suppressing fine pattern collapse enhanced, it is also possible to make appropriate adjustments to the pattern profile, exposure sensitivity, and so forth of the resist upper layer film.

Furthermore, in the present invention, the structural unit shown by the general formula (1) in the resin (A) preferably has a molar fraction of 5% or more and 50% or less, more preferably 5% or more and 30% or less. Meanwhile, the structural unit shown by the general formula (2) preferably has a molar fraction of 30% or more and 95% or less, more preferably 40% or more and 90% or less. By combining the structural units within such ranges, it is possible to provide adhesiveness while maintaining curability.

Note that when the total of the molar fractions of the structural units shown by the general formulae (1) and (2) does not reach 100%, the resin (A) contains other structural units. In such a case, as the other structural units, it is possible to use a combination of any structural units derived from α,β-unsaturated carboxylic esters, such as other acrylates, other methacrylates, other acrylamides, other methacrylamides, crotonates, maleates, and itaconates; α,β-unsaturated carboxylic acids, such as methacrylic acid, acrylic acid, maleic acid, and itaconic acid; acrylonitrile; methacrylonitrile; α,β-unsaturated lactones, such as 5,5-dimethyl-3-methylene-2-oxotetrahydrofuran; cyclic olefins, such as norbornene derivatives and tetracyclo[4.4.0.1$^{2,5}$.1$^{7,10}$]dodecene derivatives; α,β-unsaturated carboxylic anhydrides, such as maleic anhydride and itaconic anhydride; allyl ethers; vinyl ethers; vinyl esters; and vinyl silanes.

A material for forming an adhesive film containing these resins can form a material for forming an adhesive film having high adhesiveness to a resist upper layer film and having an effect of suppressing fine pattern collapse, and can be manufactured easily.

By using a material for forming an adhesive film containing such a resin for forming a multilayer resist film applied in fine processing in a manufacturing process of a semiconductor device or the like, it is possible to provide a material for forming an adhesive film that has high adhesiveness to a resist upper layer film and has an effect of suppressing fine pattern collapse, a method for forming an adhesive film, and a patterning process.

The resin can be synthesized according to a known method by polymerizing monomers protected with a protecting group as necessary, and then performing a deprotection reaction as necessary. The polymerization reaction is not particularly limited, but is preferably radical polymerization or anion polymerization. Regarding these methods, JP 2004-115630 A may be consulted.

The resin preferably has a weight-average molecular weight (Mw) of 5,000 to 70,000, more preferably 15,000 to 50,000. When the Mw is 5,000 or more, excellent film-formability can be provided, the generation of sublimation products during heat-curing can be suppressed, and the contamination of apparatuses due to sublimation products can be suppressed. Meanwhile, when the Mw is 70,000 or less, coatability failure or coating defects due to insufficient solubility to solvents can be suppressed. Furthermore, the resin preferably has a molecular weight distribution (Mw/Mn) of 1.0 to 2.8, more preferably 1.0 to 2.5. Note that in the present invention, Mw and molecular weight distribution are values measured in terms of polystyrene by gel permeation chromatography (GPC) using tetrahydrofuran (THF) as an eluent.

[(B) Thermal Acid Generator]

In the inventive material for forming an adhesive film, a thermal acid generator (B) is contained in order to promote the crosslinking reaction by heat.

Examples of a thermal acid generator (B) that can be used in the organic film material for manufacturing a semiconductor device of the present invention include the following general formula (3) and the like.

In the formula, K⁻ represents a non-nucleophilic counter ion. $R_8$, $R_9$, $R_{10}$, and $R_{11}$ each represent a hydrogen atom, a linear, branched, or cyclic alkyl group, alkenyl group, oxoalkyl group, or oxoalkenyl group having 1 to 12 carbon atoms, an aryl group having 6 to 20 carbon atoms, or an aralkyl group or aryloxoalkyl group having 7 to 12 carbon atoms, some or all of the hydrogen atoms of these groups optionally being substituted with an alkoxy group or the like. In addition, $R_8$ and $R_9$ may form a ring, and $R_8$, $R_9$, and $R_{10}$ may form a ring. When forming a ring, $R_8$ and $R_9$ or $R_8$, $R_9$, and $R_{10}$ represent an alkylene group having 3 to 10 carbon atoms, or a heterocyclic aromatic ring containing the nitrogen atom in the formula therein.

$R_8$, $R_9$, $R_{10}$, and $R_{11}$ may be identical to or different from one another. Specifically, examples of the alkyl group include a methyl group, an ethyl group, a propyl group, an isopropyl group, an n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, an adamantyl group, and the like. Examples of the alkenyl group include a vinyl group, an allyl group, a propenyl group, a butenyl group, a hexenyl group, a cyclohexenyl group, and the like. Examples of the oxoalkyl group include a 2-oxocyclopentyl group, a 2-oxocyclohexyl group, a 2-oxopropyl group, a 2-cyclopentyl-2-oxoethyl group, a 2-cyclohexyl-2-oxoethyl group, a 2-(4-methylcyclohexyl)-2-oxoethyl group, and the like. Examples of the oxoalkenyl group include a 2-oxo-4-cyclohexenyl group, a 2-oxo-4-propenyl group, and the like. Examples of the aryl group include a phenyl group, a naphthyl group, and the like; alkoxyphenyl groups, such as a p-methoxyphenyl group, an m-methoxyphenyl group, an o-methoxyphenyl group, an ethoxyphenyl group, a p-tert-butoxyphenyl group, and an m-tert-butoxyphenyl group; alkylphenyl groups, such as a 2-methylphenyl group, a 3-methylphenyl group, a 4-methylphenyl group, an ethylphenyl group, a 4-tert-butylphenyl group, a 4-butylphenyl group, and a dimethylphenyl group; alkylnaphthyl groups, such as a methylnaphthyl group and an ethylnaphthyl group; alkoxynaphthyl groups, such as a methoxynaphthyl group and an ethoxynaphthyl group; dialkylnaphthyl groups, such as a dimethylnaphthyl group and a diethylnaphthyl group; dialkoxynaphthyl groups, such as a dimethoxynaphthyl group and a diethoxynaphthyl group; and the like. Examples of the aralkyl group include a benzyl group, a phenylethyl group, a phenethyl group, and the like. Examples of the aryloxoalkyl group include 2-aryl-2-oxoethyl groups, such as a 2-phenyl-2-oxoethyl group, a 2-(1-naphthyl)-2-oxoethyl group, and a 2-(2-naphthyl)-2-oxoethyl group; and the like.

In addition, examples of the heterocyclic aromatic ring, the $R_8$, $R_9$, $R_{10}$, and $R_{11}$ having, in the ring, the nitrogen atom in the formula, include imidazole derivatives (for example, imidazole, 4-methylimidazole, 4-methyl-2-phenylimidazole, etc.), pyrazole derivatives, furazan derivatives, pyrroline derivatives (for example, pyrroline, 2-methyl-1-pyrroline, etc.), pyrrolidine derivatives (for example, pyrrolidine, N-methylpyrrolidine, pyrrolidinone, N-methylpyrrolidone, etc.), imidazoline derivatives, imidazolidine derivatives, pyridine derivatives (for example, pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, dimethylaminopyridine, etc.), pyridazine derivatives, pyrimidine derivatives, pyrazine derivatives, pyrazoline derivatives, pyrazolidine derivatives, piperidine derivatives, piperadine derivatives, morpholine derivatives, indole derivatives, isoindole derivatives, 1H-indazole derivatives, indoline derivatives, quinoline derivatives (for example, quinoline, 3-quinolinecarbonitrile, etc.), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, uridine derivatives, etc.

The non-nucleophilic counter ion of $K^-$ includes halide ions, such as a chloride ion and a bromide ion; fluoroalkyl sulfonate ions, such as triflate ion, 1,1,1-trifluoroethanesulfonate ion, and nonafluorobutanesulfonate ion; arylsulfonate ions, such as tosylate ion, benzenesulfonate ion, 4-fluorobenzenesulfonate ion, and 1,2,3,4,5-pentafluorobenzenesulfonate ion; alkylsulfonate ions, such as mesylate ion and butanesulfonate ion; imidic acid ions, such as bis(trifluoromethylsulfonyl)imide ion, bis(perfluoroethylsulfonyl)imide ion, and bis(perfluorobutylsulfonyl)imide ion; methide acid ions, such as tris(trifluoromethylsulfonyl)methide ion and tris(perfluoroethylsulfonyl)methide ion; furthermore, sulfonate ions having the α-position substituted with fluorine shown in the following general formula (4); and sulfonate ions having the α- and β-positions substituted with fluorine shown in the following general formula (5).

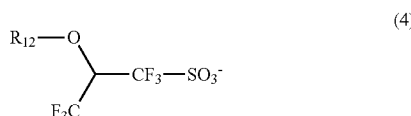

(4)

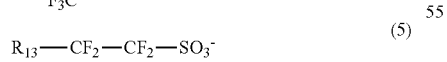

(5)

In the general formula (4), $R_{12}$ represents a hydrogen atom, a linear, branched, or cyclic alkyl group or acyl group having 1 to 23 carbon atoms, an alkenyl group having 2 to 20 carbon atoms, or an aryl group or aryloxy group having 6 to 20 carbon atoms. In the general formula (5), $R_{13}$ represents a hydrogen atom, a linear, branched, or cyclic alkyl group having 1 to 20 carbon atoms, an alkenyl group having 2 to 20 carbon atoms, or an aryl group having 6 to 20 carbon atoms.

Specific examples of the above-described thermal acid generator include the following.

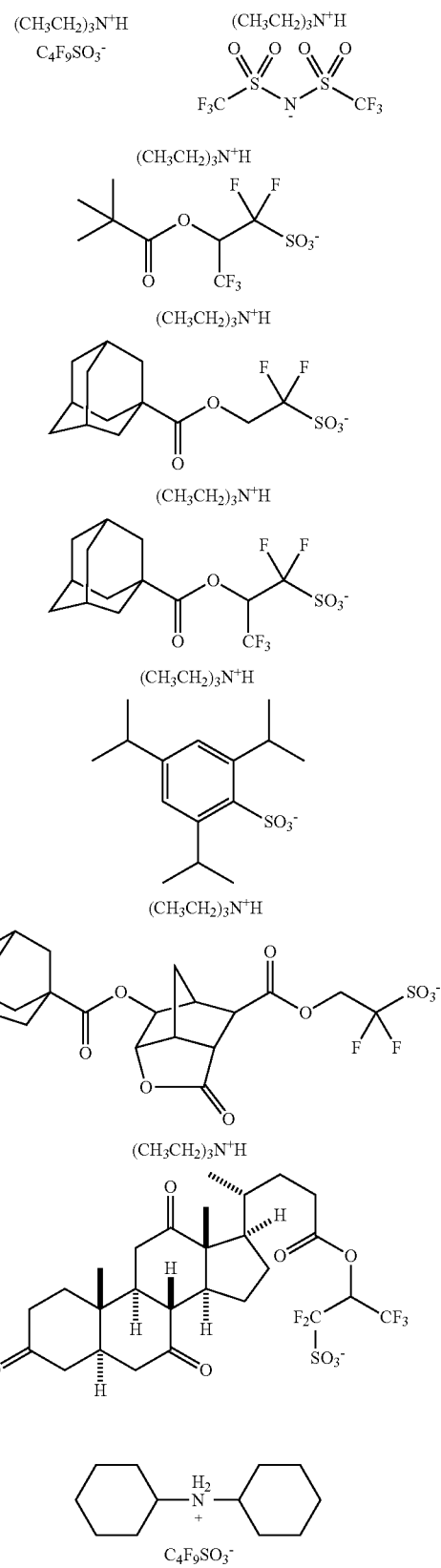

-continued

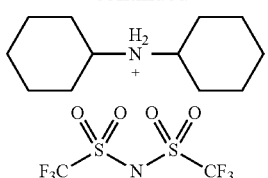
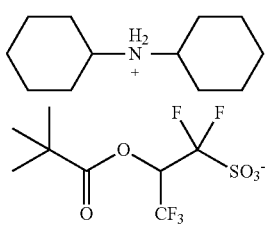
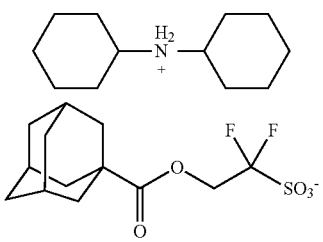
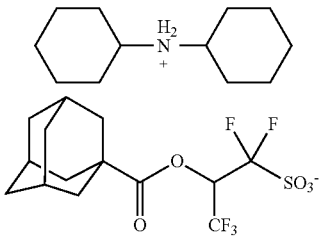
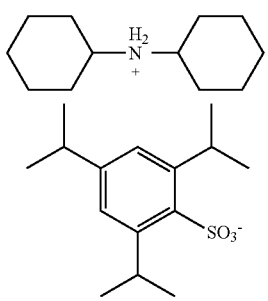
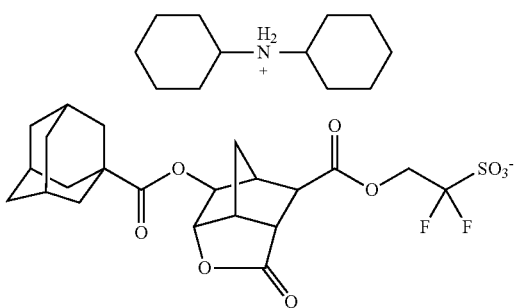

-continued

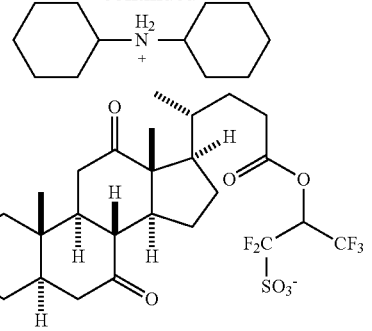

One kind of the thermal acid generator (B) contained in the inventive material for forming an adhesive film may be used or two or more kinds thereof may be used in combination. The amount of the thermal acid generator to be contained is preferably 0.05 to 30 parts, more preferably 0.1 to 10 parts based on 100 parts of the resin (A). When the amount is 0.05 parts or more, a sufficient amount of generated acid and sufficient crosslinking reaction can be achieved. When the amount is 30 parts or less, there is little risk of a mixing phenomenon occurring due to acid moving into the upper layer resist.

[(C) Organic Solvent]

The organic solvent (C) contained in the material for forming an adhesive film to be used in the inventive method for forming an adhesive film is not particularly limited as long as the organic solvent is capable of dissolving the above-described resin (A), thermal acid generator (B), and if contained, other additives, etc. However, the organic solvent (C) is preferably a mixture of one or more kinds of organic solvent having a boiling point of lower than 150° C. and one or more kinds of organic solvent having a boiling point of 150° C. or higher and lower than 220° C. Specifically, it is possible to use an organic solvent disclosed in paragraphs [0144] and [0145] of JP 2008-111103 A including: ketones, such as cyclohexanone, cyclopentanone, methyl-2-n-pentyl ketone, and 2-heptanone; alcohols, such as 3-methoxybutanol, 3-methyl-3-methoxybutanol, 1-methoxy-2-propanol, 1-ethoxy-2-propanol, and diacetone alcohol; ethers, such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters, such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; lactones, such as γ-butyrolactone; mixed solvents thereof; etc. As an organic solvent having a boiling point of lower than 150° C., propylene glycol monomethyl ether acetate, propylene glycol monomethyl ether, propylene glycol monoethyl ether, cyclopentanone, and a mixture of two or more thereof are preferably used. As an organic solvent having a boiling point of 150° C. or higher and lower than 220° C., cyclohexanone, diacetone alcohol, ethyl lactate, γ-butyrolactone, and a mixture of two or more thereof are preferably used.

[Other Additives]

The inventive material for forming an adhesive film can further contain one or more out of (D) a photo-acid generator, (E) a surfactant, (F) a crosslinking agent, and (G) a plasticizer besides the components (A) to (C). Each component will be described below.

[(D) Photo-Acid Generator]

The inventive material for forming an adhesive film may contain a photo-acid generator (D) in order to adjust the pattern profile, exposure sensitivity, and so forth of a resist upper layer film appropriately. One kind of the photo-acid generator may be used or a combination of two or more kinds thereof may be used. As the photo-acid generator, those disclosed in paragraphs [0160] to [0179] of JP 2009-126940 A can be used, for example. The amount of photo-acid generator to be contained is preferably 0.05 to 30 parts, more preferably 0.1 to 10 parts based on 100 parts of the resin (A). When the amount of photo-acid generator contained is within the above ranges, resolution is favorable, and there is no risk of problems of foreign substances occurring after resist development or during removal.

[(E) Surfactant]

In the inventive material for forming an adhesive film, a surfactant (E) can be contained so as to enhance the coating property in spin-coating. One kind of surfactant may be used or two or more kinds thereof may be used in combination. As examples of the surfactant, those disclosed in paragraphs [0142] to [0147] of JP 2009-269953 A can be used. When the surfactant is to be contained, the contained amount is preferably 0.001 to 20 parts, more preferably 0.01 to 10 parts based on 100 parts of the resin (A).

[(F) Crosslinking Agent]

In addition, in the inventive material for forming an adhesive film, a crosslinking agent (F) can also be contained so as to increase curability and to further suppress intermixing with a resist upper layer film. The crosslinking agent is not particularly limited, and known various types of crosslinking agents can be widely used. Examples thereof include melamine-based crosslinking agents, glycoluril-based crosslinking agents, benzoguanamine-based crosslinking agents, urea-based crosslinking agents, β-hydroxyalkylamide-based crosslinking agents, isocyanurate-based crosslinking agents, aziridine-based crosslinking agents, oxazoline-based crosslinking agents, epoxy-based crosslinking agents, and phenol-based crosslinking agents. One kind of the crosslinking agent (F) may be used or two or more kinds thereof may be used in combination. When the crosslinking agent is to be contained, the amount to be contained is preferably 5 to 50 parts, more preferably 10 to 40 parts based on 100 parts of the resin (A). When the contained amount is 5 parts or more, sufficient curability can be exhibited, so that intermixing with the resist upper layer film can be suppressed. Meanwhile, when the contained amount is 50 parts or less, there is no risk of adhesiveness degradation due to a decrease in the proportion of the resin (A) in the composition.

Specific examples of the melamine-based crosslinking agents include hexamethoxymethylated melamine, hexabutoxymethylated melamine, alkoxy- and/or hydroxy-substituted derivatives thereof, and partial self-condensates thereof. Specific examples of the glycoluril-based crosslinking agents include tetramethoxymethylated glycoluril, tetrabutoxymethylated glycoluril, alkoxy- and/or hydroxy-substituted derivatives thereof, and partial self-condensates thereof. Specific examples of the benzoguanamine-based crosslinking agents include tetramethoxymethylated benzoguanamine, tetrabutoxymethylated benzoguanamine, alkoxy- and/or hydroxy-substituted derivatives thereof, and partial self-condensates thereof. Specific examples of the urea-based crosslinking agents include dimethoxymethylated dimethoxyethyleneurea, alkoxy- and/or hydroxy-substituted derivatives thereof, and partial self-condensates thereof. A specific example of the p-hydroxyalkylamide-based crosslinking agents includes N,N,N',N'-tetra(2-hydroxyethyl)adipic acid amide. Specific examples of the isocyanurate-based crosslinking agents include triglycidyl isocyanurate and triallyl isocyanurate. Specific examples of the aziridine-based crosslinking agents include 4,4'-bis(ethyleneiminocarbonylamino)diphenylmethane and 2,2-bishydroxymethylbutanol-tris[3-(1-aziridinyl)propionate]. Specific examples of the oxazoline-based crosslinking agents include 2,2'-isopropylidene bis(4-benzyl-2-oxazoline), 2,2'-isopropylidene bis(4-phenyl-2-oxazoline), 2,2'-methylenebis4,5-diphenyl-2-oxazoline, 2,2'-methylenebis-4-phenyl-2-oxazoline, 2,2'-methylenebis-4-tert-butyl-2-oxazoline, 2,2'-bis(2-oxazoline), 1,3-phenylenebis(2-oxazoline), 1,4-phenylenebis(2-oxazoline), and a 2-isopropenyloxazoline copolymer. Specific examples of the epoxy-based crosslinking agents include diglycidyl ether, ethylene glycol diglycidyl ether, 1,4-butanediol diglycidyl ether, 1,4-cyclohexanedimethanol diglycidyl ether, poly(glycidyl methacrylate), trimethylolethane triglycidyl ether, trimethylolpropane triglycidyl ether, and pentaerythritol tetraglycidyl ether.

Specific examples of the phenol-based crosslinking agents include compounds shown by the following general formula (6).

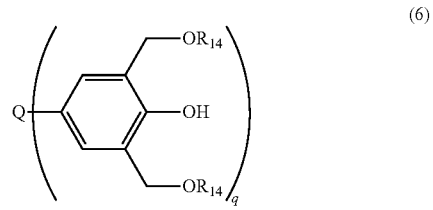

In the formula, Q represents a single bond or a hydrocarbon group with a valency of "q" having 1 to 20 carbon atoms. $R_{14}$ represents a hydrogen atom or an alkyl group having 1 to 20 carbon atoms. "q" represents an integer of 1 to 5.

Q represents a single bond or a hydrocarbon group with a valency of "q" having 1 to 20 carbon atoms. "q" represents an integer of 1 to 5, more preferably 2 or 3. Specific examples of Q include methane, ethane, propane, butane, isobutane, pentane, cyclopentane, hexane, cyclohexane, methyl pentane, methyl cyclohexane, dimethyl cyclohexane, trimethyl cyclohexane, benzene, toluene, xylene, ethyl benzene, ethyl isopropylbenzene, diisopropylbenzene, methylnaphthalene, ethyl naphthalene, and eicosane. $R_{14}$ represents a hydrogen atom or an alkyl group having 1 to 20 carbon atoms. Specific examples of the alkyl group having 1 to 20 carbon atoms include a methyl group, an ethyl group, a propyl group, an isopropyl group, a butyl group, an isobutyl group, a pentyl group, an isopentyl group, a hexyl group, an octyl group, an ethylhexyl group, a decyl group, and an eicosanyl group. A hydrogen atom or a methyl group is preferable.

Specific examples of the compound shown by the general formula (6) include the following compounds. In particular, in view of enhancing the curability and film thickness uniformity of the adhesive film, hexamethoxymethylated compounds of triphenolmethane, triphenolethane, 1,1,1-tris (4-hydroxyphenyl)ethane, and tris (4-hydroxyphenyl)-1-ethyl-4-isopropylbenzene are preferable.

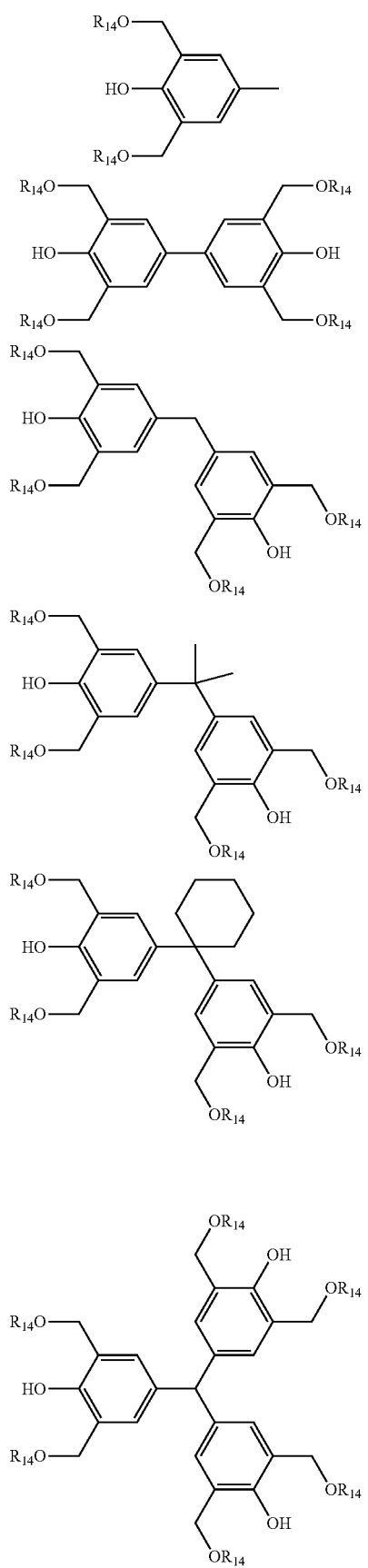
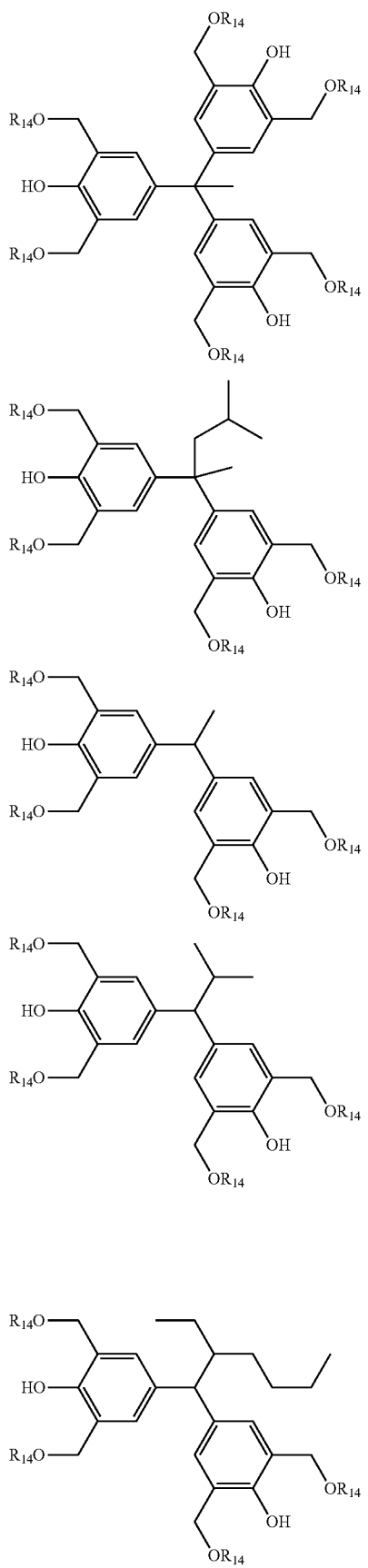

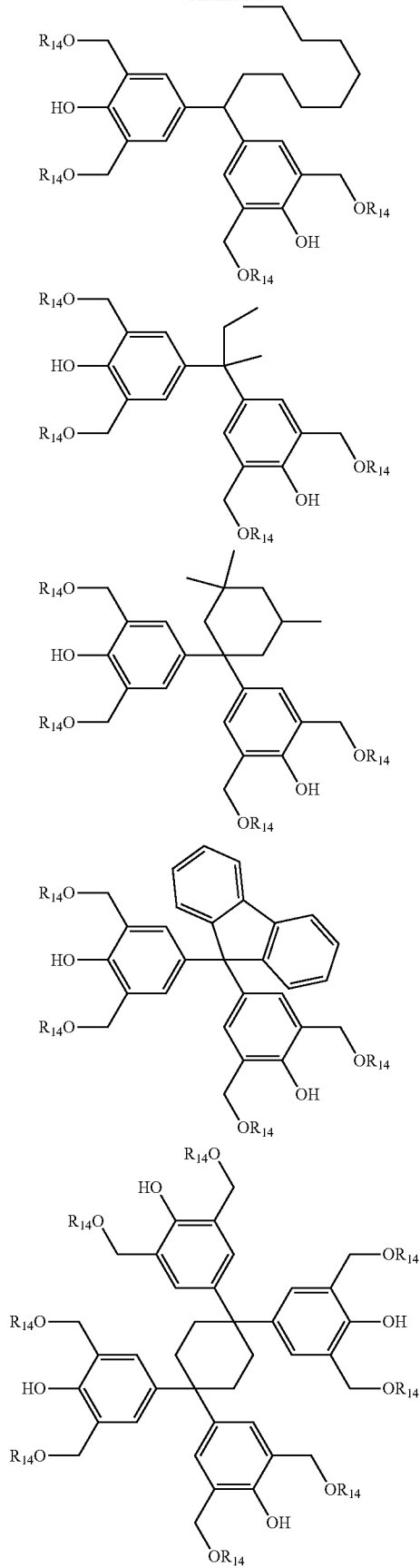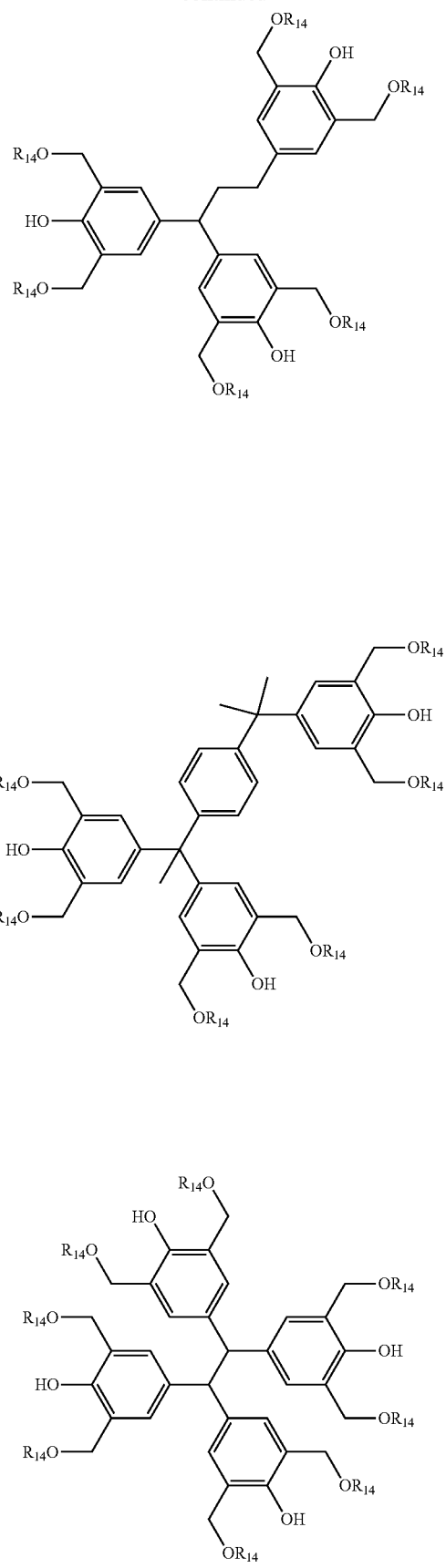

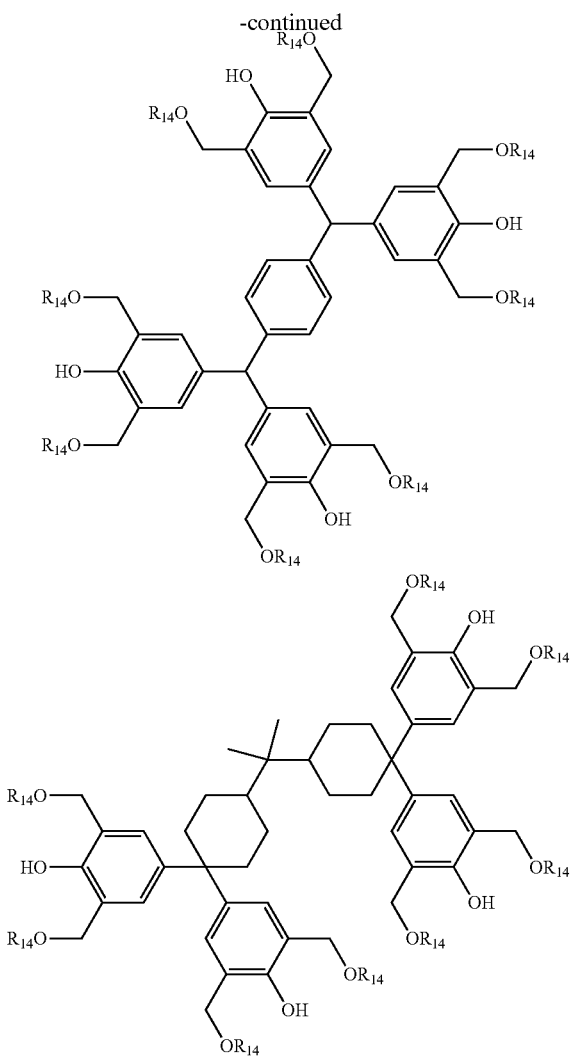

One kind of the crosslinking agent (F) can be used, or two or more kinds thereof can be used in combination. When the crosslinking agent (F) is to be contained, the contained amount is preferably 10 mass % to 50 mass %, more preferably 15 mass % to 30 mass % based on 100 parts of the resin (A). When the contained amount is 10 mass % or more, sufficient curability can be provided, so that intermixing with the resist upper layer film can be suppressed. Meanwhile, when the contained amount is 50 mass % or less, there is no risk of adhesiveness degradation since there is no decrease in the proportion of the resin (A) in the composition.

[(G) Plasticizer]

Furthermore, in the inventive material for forming an adhesive film, a plasticizer can be contained. The plasticizer is not particularly limited, and known various types of plasticizers can be widely used. Examples thereof include low-molecular-weight compounds, such as phthalic acid esters, adipic acid esters, phosphoric acid esters, trimellitic acid esters, and citric acid esters; and polymers such as polyethers, polyesters, and polyacetal-based polymers disclosed in JP 2013-253227 A. When the plasticizer (G) is contained, the contained amount is preferably 5 mass % to 500 mass % based on 100 parts of the resin (A). When the contained amount is within such a range, the inventive material can achieve excellent filling and leveling of a pattern.

The thickness of the material for forming an adhesive film used in the present invention is selected appropriately, but is preferably 2 to 100 nm, particularly preferably 5 to 20 nm.

In addition, the inventive material for forming an adhesive film is extremely useful as an adhesive film material for multilayer resist processes such as a 2-layer resist process and a 4-layer resist process using a resist underlayer film and a silicon-containing middle layer film.

The silicon-containing middle layer film can be a silicon-containing resist middle layer film or an inorganic hard mask middle layer film in accordance with the patterning processes described below. The inorganic hard mask middle layer film is preferably selected from a silicon oxide film, a silicon nitride film, and a silicon oxynitride film.

[Method for Forming Adhesive Film]

The present invention provides a method for forming an adhesive film by using the above-described material for forming an adhesive film, the adhesive film having high adhesiveness to a resist upper layer film and having an effect of suppressing fine pattern collapse in a fine patterning process according to a multilayer resist method in a semiconductor device manufacturing process.

In the inventive method for forming an adhesive film, a substrate to be processed is coated with the above-described material for forming an adhesive film by a spin-coating method or the like. After the spin-coating, baking (a heat treatment) is performed in order to evaporate the organic solvent and promote a crosslinking reaction to prevent intermixing with the resist upper layer film or the silicon-containing middle layer film. The baking is preferably performed at 100° C. or higher and 300° C. or lower for 10 to 600 seconds, more preferably at 200° C. or higher and 250° C. or lower for 10 to 300 seconds. Considering the effect on damage to the adhesive film and deformation of the wafer, the upper limit of the heating temperature in the wafer process of the lithography is preferably set to 300° C. or lower, more preferably 250° C. or lower.

That is, the present invention provides a method for forming an adhesive film that functions as an adhesive layer employed in a semiconductor device manufacturing process, the method including:

spin-coating a substrate to be processed with the above-described material for forming an adhesive film; and heating the substrate coated with the material for forming an adhesive film at a temperature of 100° C. or higher to 300° C. or lower for 10 to 600 seconds to form a cured film.

Alternatively, in the inventive method for forming an adhesive film, an adhesive film can also be formed by coating a substrate to be processed with the inventive material for forming an adhesive film by a spin-coating method or the like in the same manner as above and curing the material for forming an adhesive film by baking in an atmosphere having an oxygen concentration of 0.1% or more to 21% or less. By baking the inventive material for forming an adhesive film in such an oxygen atmosphere, a sufficiently cured film can be obtained.

That is, the present invention provides a method for forming an adhesive film that functions as an adhesive layer employed in a semiconductor device manufacturing process, the method including:

spin-coating a substrate to be processed with the above-described material for forming an adhesive film; and heating the substrate coated with the material for forming an adhesive film in an atmosphere having an oxygen concentration of 0.1% or more to 21% or less to form a cured film.

The atmosphere during the baking may be in air, or an inert gas such as $N_2$, Ar, and He may also be introduced. In this event, the atmosphere may have an oxygen concentration of less than 0.1%. In addition, the baking temperature and so forth can be as described above. The crosslinking reaction during the adhesive film formation can be promoted without causing degradation of the substrate to be processed even when the substrate to be processed contains a material that is unstable to heating under an oxygen atmosphere.

That is, the present invention provides a method for forming an adhesive film that functions as an adhesive layer employed in a semiconductor device manufacturing process, the method including:

spin-coating a substrate to be processed with the above-described material for forming an adhesive film; and heating the substrate coated with the material for forming an adhesive film in an atmosphere having an oxygen concentration of less than 0.1% to form a cured film.

[Patterning Process]

The present invention provides a patterning process for forming a pattern in a substrate to be processed, including the steps of:

(I-1) applying the above-described material for forming an adhesive film on the substrate to be processed and then performing a heat treatment to form an adhesive film;

(I-2) forming a resist upper layer film on the adhesive film by using a photoresist material;

(I-3) subjecting the resist upper layer film to pattern exposure and then to development with a developer to form a circuit pattern in the resist upper layer film;

(I-4) transferring the pattern to the adhesive film by dry etching while using the resist upper layer film having the formed circuit pattern as a mask; and (I-5) forming the pattern in the substrate to be processed by processing the substrate to be processed while using the adhesive film having the transferred pattern as a mask.

The inventive patterning process will be described with the following 4-layer resist process as an example, but is not limited to this process. Firstly, the present invention provides a patterning process for forming a pattern in a substrate to be processed, including at least the following steps:

forming a resist underlayer film by using an organic film material on the substrate to be processed;

forming a silicon-containing middle layer film (silicon-containing resist middle layer film) by using a resist middle layer film material containing a silicon atom on the resist underlayer film;

forming an adhesive film by using the inventive material for forming an adhesive film on the silicon-containing resist middle layer film;

forming a resist upper layer film by using a resist upper layer film material including a photoresist composition on the adhesive film so that a multilayer resist film is constructed;

forming a resist upper layer film pattern in the resist upper layer film by exposing a pattern circuit region of the resist upper layer film, and then developing with a developer;

forming an adhesive film pattern by etching the adhesive film while using the obtained resist upper layer film pattern as an etching mask;

forming a silicon-containing resist middle layer film pattern by etching the silicon-containing resist middle layer film while using the obtained adhesive film pattern as an etching mask;

forming a resist underlayer film pattern by etching the resist underlayer film while using the obtained silicon-containing resist middle layer film pattern as an etching mask; and further forming the pattern in the substrate to be processed by etching the substrate to be processed while using the obtained resist underlayer film pattern as an etching mask.

That is, the present invention provides a patterning process for forming a pattern in a substrate to be processed, including the steps of:

(II-1) forming a resist underlayer film on the substrate to be processed;

(II-2) forming a silicon-containing resist middle layer film on the resist underlayer film;

(II-3) applying the above-described material for forming an adhesive film on the silicon-containing resist middle layer film and then performing a heat treatment to form an adhesive film;

(II-4) forming a resist upper layer film on the adhesive film by using a photoresist material;

(II-5) subjecting the resist upper layer film to pattern exposure and then to development with a developer to form a circuit pattern in the resist upper layer film;

(II-6) transferring the pattern to the adhesive film by dry etching while using the resist upper layer film having the formed circuit pattern as a mask;

(II-7) transferring the pattern to the silicon-containing resist middle layer film by dry etching while using the adhesive film having the formed pattern as a mask;

(II-8) transferring the pattern to the resist underlayer film by dry etching while using the silicon-containing resist middle layer film having the transferred pattern as a mask; and (II-9) forming the pattern in the substrate to be processed by processing the substrate to be processed while using the resist underlayer film having the transferred pattern as a mask.

As the silicon-containing resist middle layer film in the 4-layer resist process, a polysilsesquioxane-based middle layer film is also favorably used. The silicon-containing resist middle layer film having an antireflective effect can suppress the reflection. Particularly, for 193-nm light exposure, a material containing many aromatic groups and having high substrate etching resistance is used as a resist underlayer film, so that the k-value and thus the substrate reflection are increased. However, the reflection can be suppressed by the silicon-containing resist middle layer film, and so the substrate reflection can be reduced to 0.5% or less. As the silicon-containing resist middle layer film having the antireflective effect, a polysilsesquioxane is preferably used, the polysilsesquioxane having anthracene for 248-nm and 157-nm light exposure, or a phenyl group or a light-absorbing group having a silicon-silicon bond for 193-nm light exposure in a pendant structure, and being crosslinked by an acid or heat.

In this case, forming a silicon-containing resist middle layer film by a spin-coating method is simpler and more advantageous regarding cost than a CVD method.

Alternatively, an inorganic hard mask middle layer film may be formed as the silicon-containing middle layer film, and in this case, it is possible to perform at least the following steps:

forming a resist underlayer film by using an organic film material on the substrate to be processed;

forming an inorganic hard mask middle layer film selected from a silicon oxide film, a silicon nitride film, and a silicon oxynitride film on the resist underlayer film;

forming an adhesive film by using the inventive material for forming an adhesive film on the inorganic hard mask middle layer film;

forming a resist upper layer film by using a resist upper layer film material including a photoresist composition on the adhesive film;

forming a resist upper layer film pattern in the resist upper layer film by exposing a pattern circuit region of the resist upper layer film, and then developing with a developer;

forming an adhesive film pattern by etching the adhesive film while using the obtained resist upper layer film pattern as an etching mask;

forming an inorganic hard mask middle layer film pattern by etching the inorganic hard mask middle layer film while using the obtained adhesive film pattern as an etching mask;

forming a resist underlayer film pattern by etching the resist underlayer film while using the obtained inorganic hard mask middle layer film pattern as an etching mask; and further forming the pattern in the substrate to be processed by etching the substrate to be processed while using the obtained resist underlayer film pattern as an etching mask.

That is, the present invention provides a patterning process for forming a pattern in a substrate to be processed, including the steps of:

(III-1) forming a resist underlayer film on the substrate to be processed;

(III-2) forming an inorganic hard mask middle layer film selected from a silicon oxide film, a silicon nitride film, and a silicon oxynitride film on the resist underlayer film;

(III-3) applying the above-described material for forming an adhesive film on the inorganic hard mask middle layer film and then performing a heat treatment to form an adhesive film;

(III-4) forming a resist upper layer film on the adhesive film by using a photoresist material;

(III-5) subjecting the resist upper layer film to pattern exposure and then to development with a developer to form a circuit pattern in the resist upper layer film;

(III-6) transferring the pattern to the adhesive film by dry etching while using the resist upper layer film having the formed circuit pattern as a mask;

(III-7) transferring the pattern to the inorganic hard mask middle layer film by dry etching while using the adhesive film having the formed pattern as a mask;

(III-8) transferring the pattern to the resist underlayer film by dry etching while using the inorganic hard mask middle layer film having the transferred pattern as a mask; and (III-9) forming the pattern in the substrate to be processed by processing the substrate to be processed while using the resist underlayer film having the transferred pattern as a mask.

In the case where an inorganic hard mask middle layer film is formed on the resist underlayer film as described above, a silicon oxide film, a silicon nitride film, and a silicon oxynitride film (SiON film) can be formed by a CVD method, an ALD method, or the like. In particular, the inorganic hard mask middle layer film is preferably formed by a CVD method or an ALD method. The method for forming the silicon nitride film is disclosed in, for example, JP 2002-334869 A and WO 2004/066377 A1. The film thickness of the inorganic hard mask middle layer film is preferably 5 to 200 nm, more preferably 10 to 100 nm. As the inorganic hard mask middle layer film, a SiON film is most preferably used, being effective as an antireflective coating. When the SiON film is formed, the substrate temperature reaches 300 to 500° C. Hence, the resist underlayer film needs to withstand the temperature of 300 to 500° C.

The resist upper layer film in the 4-layer resist process may be a positive type or a negative type, and any generally-used photoresist composition can be employed, but the resist upper layer film is preferably formed using a negative resist composition. Furthermore, the resist upper layer film has preferably been formed using a resist upper layer film material containing at least an organic metal compound and a solvent. The organic metal compound more preferably contains at least one selected from titanium, cobalt, copper, zinc, zirconium, lead, indium, tin, antimony, and hafnium. After spin-coating of the photoresist composition, pre-baking is preferably performed at 60 to 180° C. for 10 to 300 seconds. Then, light exposure, post-exposure baking (PEB), and development are performed according to conventional methods to obtain the resist upper layer film pattern. Note that the thickness of the resist upper layer film is not particularly limited, but is preferably 30 to 500 nm, and 50 to 400 nm is particularly preferable.

A circuit pattern (resist upper layer film pattern) is formed in the resist upper layer film. In the circuit pattern formation, the circuit pattern is preferably formed by a lithography using light having a wavelength of 10 nm or more to 300 nm or less, a direct drawing by electron beam, a nanoimprinting, or a combination thereof.

Note that examples of exposure light include a high-energy beam with a wavelength of 300 nm or less, specifically, deep ultraviolet ray, KrF excimer laser beam (248 nm), ArF excimer laser beam (193 nm), $F_2$ laser beam (157 nm), $Kr_2$ laser beam (146 nm), $Ar_2$ laser beam (126 nm), soft X-ray of 3 to 20 nm (EUV), electron beam (EB), ion beam, X-ray, and the like.

Additionally, in the formation of the circuit pattern, the circuit pattern is preferably developed by alkaline development or development with an organic solvent as the development method.

Next, etching is performed while using the obtained resist upper layer film pattern as a mask. The etching of the adhesive film in the 4-layer resist process is performed by using an oxygen-based gas while using the resist upper layer film pattern as a mask. Thereby, the adhesive film pattern is formed.

Subsequently, etching is performed while using the obtained adhesive film pattern as a mask. The etching of the silicon-containing resist middle layer film and the inorganic hard mask middle layer film is performed by using a fluorocarbon-based gas while using the adhesive film pattern as a mask. Thereby, the silicon-containing resist middle layer film pattern and the inorganic hard mask middle layer film pattern are formed.

The etching of the adhesive film may be performed continuously before the etching of the silicon-containing middle layer film. Alternatively, after the adhesive film is etched alone, the etching apparatus is changed, for example, and then the etching of the silicon-containing middle layer film may be performed.

Next, the resist underlayer film is etched while using the obtained silicon-containing resist middle layer film pattern and inorganic hard mask middle layer film pattern as masks.

Subsequently, the substrate to be processed can be etched according to a conventional method. For example, the substrate to be processed made of $SiO_2$, SiN, or silica-based low-dielectric insulating film is etched mainly with a fluorocarbon-based gas; and p-Si, Al, or W is etched mainly with a chlorine- or bromine-based gas. When the substrate is processed by etching with a fluorocarbon-based gas, the silicon-containing middle layer film pattern in the 3-layer resist process is removed when the substrate is processed. When the substrate is etched with a chlorine- or bromine-based gas, the silicon-containing middle layer film pattern needs to be removed by additional dry etching with a fluorocarbon-based gas after the substrate processing.

Note that the substrate to be processed is not particularly limited, and it is possible to use a semiconductor device substrate or the semiconductor device substrate coated with any of a metal film, a metal carbide film, a metal oxide film, a metal nitride film, a metal oxycarbide film, or a metal oxynitride film. As the metal, it is possible to use silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof.

Specific examples include: substrates made of Si, α-Si, p-Si, $SiO_2$, SiN, SiON, W, TiN, Al, or the like; the substrate coated with a layer to be processed; etc. Examples of the layer to be processed include: various Low-k films made of Si, $SiO_2$, SiON, SiN, p-Si, α-Si, W, W—Si, Al, Cu, Al—Si, or the like; and stopper films thereof. Generally, the layer can be formed to have a thickness of 50 to 10,000 nm, in particular, 100 to 5,000 nm. Note that when the layer to be processed is formed, the substrate and the layer to be processed are formed from different materials.

Hereinbelow, an example of the 4-layer resist process will be specifically described with reference to FIG. 1. As shown in FIG. 1 (A), in the 4-layer resist process, a resist underlayer film 3 is formed by using an organic film material on a layer 2 to be processed that has been stacked on a substrate 1. Then, a silicon-containing middle layer film 4 is formed, an adhesive film 5 is formed by using the inventive material for forming an adhesive film thereon, and a resist upper layer film 6 is formed thereon.

Next, as shown in FIG. 1 (B), an exposed part 7 of the resist upper layer film is exposed to light, followed by PEB and development to form a resist pattern 6a (FIG. 1 (C)). While using the obtained resist pattern 6a as a mask, the adhesive film 5 is etched by using an $O_2$-based gas. Thereby, an adhesive film pattern 5a is formed (FIG. 1 (D)). While using the obtained adhesive film pattern 5a as a mask, the silicon-containing middle layer film 4 is etched by using a CF-based gas. Thereby, a silicon-containing middle layer film pattern 4a is formed (FIG. 1 (E)). After the adhesive film pattern 5a is removed, the resist underlayer film 3 is etched with an $O_2$-based gas while using the obtained silicon-containing middle layer film pattern 4a as a mask. Thereby, a resist underlayer film pattern 3a is formed (FIG. 1 (F)). Furthermore, after the silicon-containing middle layer film pattern 4a is removed, the layer 2 to be processed is etched while using the resist underlayer film pattern 3a as a mask. Thus, a pattern 2a is formed (FIG. 1 (G)).

As described above, the inventive patterning processes make it possible to form a fine pattern with high precision in a substrate to be processed in the multilayer resist processes.

EXAMPLE

Hereinafter, the present invention will be described further specifically with reference to Synthesis Examples, Comparative Synthesis Examples, Examples, and Comparative Examples. However, the present invention is not limited thereto. Note that the molecular weight was measured by gel permeation chromatography (GPC) using tetrahydrofuran (THF) or N,N-dimethylformamide (DMF) as an eluent, and dispersity (Mw/Mn) was calculated from the weight-average molecular weight (Mw) and the number-average molecular weight (Mn) in terms of polystyrene.

Polymers (A1) to (A15) and comparative polymers (R1) to (R5) to be used as a resin (A) for materials for forming an adhesive film were synthesized using the monomers (B1) to (B9) shown below.

(B1)

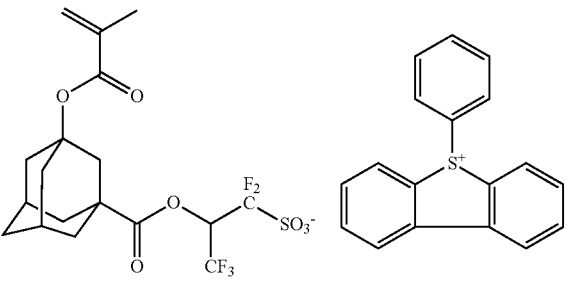

(B2)

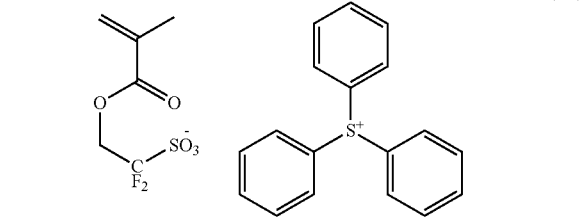

(B3)

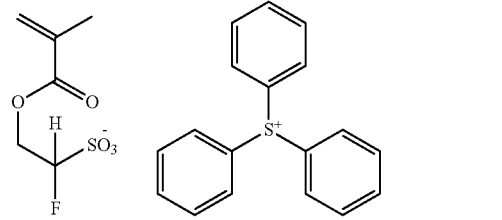

(B4)

(B5)

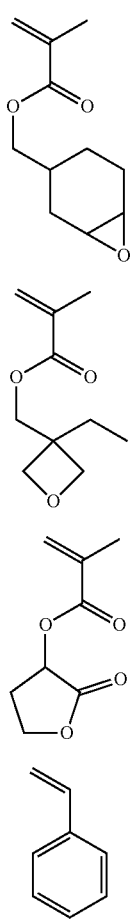

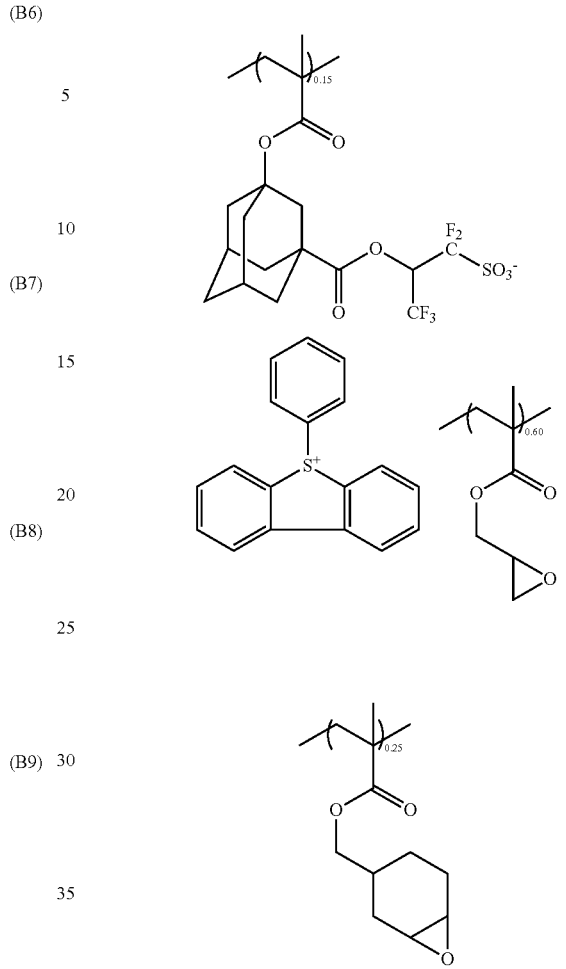

[Synthesis Example 1] Synthesis of Polymer (A1)

Under a nitrogen atmosphere, 45.1 g of the monomer (B1), 34.8 g of the monomer (B5), 20.0 g of the monomer (B6), 4.70 g of V-601 (Dimethyl 2,2'-Azobis(isobutyrate), available from Wako Pure Chemical Industries Ltd.), 1.28 g of SEA (2-Mercaptoethanol, available from Tokyo Chemical Industry Co., Ltd.), and 340 g of DAA (diacetone alcohol) were measured and charged into a 1-L flask. Subsequently, degassing was performed while stirring the mixture to prepare a monomeric polymerization initiator solution. 60 g of DAA was measured and charged into a different 1-L flask having a nitrogen atmosphere. After degassing while stirring, the resultant was heated until the inner temperature reached 80° C. The monomeric polymerization initiator solution was added thereto dropwise over 4 hours. Subsequently, the polymer solution was stirred for 16 hours while maintaining the temperature at 80° C., and then was cooled to room temperature. The obtained polymer solution was added dropwise to 1,500 g of vigorously stirred hexane, and the deposited polymer was collected by filtration. Furthermore, the obtained polymer was washed twice with 600 g of hexane. After that, the polymer was vacuum dried at 50° C. for 20 hours to obtain a polymer (A1) in white powder form (yield: 101.5 g, 96%). When the weight-average molecular weight (Mw) and dispersity (Mw/Mn) of the polymer (A1) were measured by GPC, the results were: Mw=15,300, Mw/Mn=1.98.

[Synthesis Example 2] Synthesis of Polymer (A2)

Under a nitrogen atmosphere, 45.1 g of the monomer (B1), 34.8 g of the monomer (B5), 20.0 g of the monomer (B6), 4.70 g of V-601, and 340 g of DAA were measured and charged into a 1-L flask. Subsequently, degassing was performed while stirring the mixture to prepare a monomeric polymerization initiator solution. 60 g of DAA was measured and charged into a different 1-L flask having a nitrogen atmosphere. After degassing while stirring, the resultant was heated until the inner temperature reached 80° C. The monomeric polymerization initiator solution was added thereto dropwise over 4 hours. Subsequently, the polymer solution was stirred for 16 hours while maintaining the temperature at 80° C., and then was cooled to room temperature. The obtained polymer solution was added dropwise to 1,500 g of vigorously stirred hexane, and the deposited polymer was collected by filtration. Furthermore, the obtained polymer was washed twice with 600 g of hexane. After that, the polymer was vacuum dried at 50° C. for 20 hours to obtain a polymer (A2) in white powder form (yield: 102.8 g, 98%). When the weight-average molecular weight (Mw) and dispersity (Mw/Mn) of the polymer (A2) were measured by GPC, the results were: Mw=29,300, Mw/Mn=2.20.

(A2)

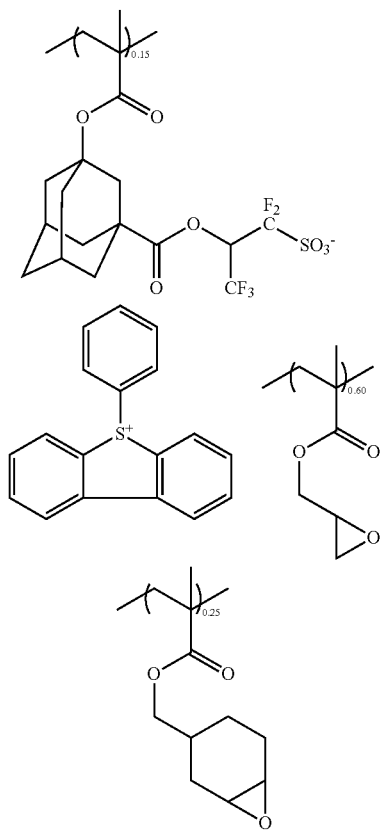

[Synthesis Example 3] Synthesis of Polymer (A3)

Under a nitrogen atmosphere, 45.1 g of the monomer (B1), 34.8 g of the monomer (B5), 20.0 g of the monomer (B6), 0.94 g of V-601, and 340 g of DAA were measured and charged into a 1-L flask. Subsequently, degassing was performed while stirring the mixture to prepare a monomeric polymerization initiator solution. 60 g of DAA was measured and charged into a different 1-L flask having a nitrogen atmosphere. After degassing while stirring, the resultant was heated until the inner temperature reached 80° C. The monomeric polymerization initiator solution was added thereto dropwise over 4 hours. Subsequently, the polymer solution was stirred for 16 hours while maintaining the temperature at 80° C., and then was cooled to room temperature. The obtained polymer solution was added dropwise to 1,500 g of vigorously stirred hexane, and the deposited polymer was collected by filtration. Furthermore, the obtained polymer was washed twice with 600 g of hexane. After that, the polymer was vacuum dried at 50° C. for 20 hours to obtain a polymer (A3) in white powder form (yield: 99.3 g, 98%). When the weight-average molecular weight (Mw) and dispersity (Mw/Mn) of the polymer (A3) were measured by GPC, the results were: Mw=52,500, Mw/Mn=2.29.

(A3)

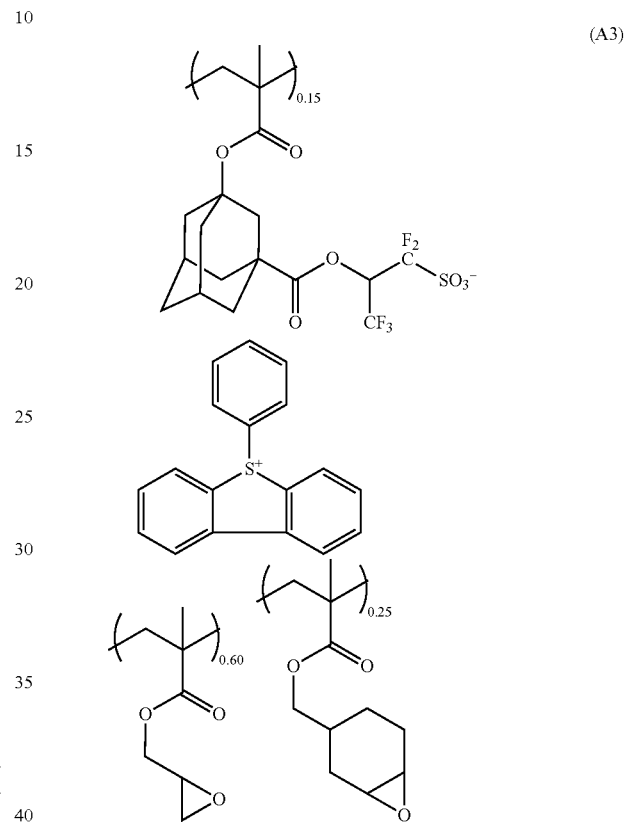

[Synthesis Examples 4 to 15] Synthesis of Polymers (A4) to (A15)

Except that the monomers and polymerization initiator shown in Table 1 were used, reaction and post-processing were performed under the same conditions as in Synthesis Examples 1 to 3 to obtain polymers (A4) to (A15) as products. In addition, the weight-average molecular weight (Mw) and dispersity (Mw/Mn) determined by GPC are shown in Table 1.

TABLE 1

| Synthesis Example | Polymer | Monomer (B1) | Monomer (B2) | Monomer (B3) | Monomer (B4) | Monomer (B5) | Monomer (B6) | Monomer (B7) | Polymerization initiator (V-601) | Chain transfer agent (SEA) | Molecular weight (Mw) | Dispersity (Mw/Mn) |
|---|---|---|---|---|---|---|---|---|---|---|---|---|
| 1 | A1 | 15 | | | | 60 | 25 | | 5.0 | 4.0 | 15,300 | 1.98 |
| 2 | A2 | 15 | | | | 60 | 25 | | 5.0 | — | 29,300 | 2.20 |
| 3 | A3 | 15 | | | | 60 | 25 | | 1.0 | — | 52,500 | 2.29 |
| 4 | A4 | 10 | | | | 60 | 30 | | 5.0 | — | 28,100 | 2.25 |
| 5 | A5 | 10 | | | | 60 | 30 | | 1.0 | — | 51,200 | 2.27 |
| 6 | A6 | 15 | | | | 85 | | | 5.0 | — | 32,100 | 2.26 |
| 7 | A7 | 15 | | | | 85 | | | 1.0 | — | 52,500 | 2.25 |
| 8 | A8 | 15 | | | | 60 | | 25 | 5.0 | — | 28,500 | 2.18 |
| 9 | A9 | 15 | | | | 60 | | 25 | 1.0 | — | 50,900 | 2.21 |

TABLE 1-continued

| Synthesis Example | Polymer | Monomer (B1) | Monomer (B2) | Monomer (B3) | Monomer (B4) | Monomer (B5) | Monomer (B6) | Monomer (B7) | Polymerization initiator (V-601) | Chain transfer agent (SEA) | Molecular weight (Mw) | Dispersity (Mw/Mn) |
|---|---|---|---|---|---|---|---|---|---|---|---|---|
| 10 | A10 | | 15 | | | 60 | 25 | | 5.0 | — | 30,400 | 2.22 |
| 11 | A11 | | 15 | | | 60 | 25 | | 1.0 | — | 53,000 | 2.31 |
| 12 | A12 | | | 15 | | 60 | 25 | | 5.0 | — | 24,200 | 2.21 |
| 13 | A13 | | | 15 | | 60 | 25 | | 1.0 | — | 43,300 | 2.26 |
| 14 | A14 | | | | 15 | 60 | 25 | | 5.0 | — | 24,000 | 2.23 |
| 15 | A15 | | | | 15 | 60 | 25 | | 1.0 | — | 42,800 | 2.29 |

[Comparative Synthesis Example 1] Synthesis of Comparative Polymer (R1)

Under a nitrogen atmosphere, 100.0 g of the monomer (B5), 1.62 g of V-601, and 340 g of PGMEA (propylene glycol monomethyl ether acetate) were measured and charged into a 1-L flask. Subsequently, degassing was performed while stirring the mixture to prepare a monomeric polymerization initiator solution. 60 g of PGMEA was measured and charged into a different 1-L flask having a nitrogen atmosphere. After degassing while stirring, the resultant was heated until the inner temperature reached 80° C. The monomeric polymerization initiator solution was added thereto dropwise over 4 hours. Subsequently, the polymer solution was stirred for 16 hours while maintaining the temperature at 80° C., and then was cooled to room temperature. The obtained polymer solution was added dropwise to 1,500 g of vigorously stirred hexane, and the deposited polymer was collected by filtration. Furthermore, the obtained polymer was washed twice with 600 g of hexane. After that, the polymer was vacuum dried at 50° C. for 20 hours to obtain a polymer (R1) in white powder form (yield: 98.2 g, 97%). When the weight-average molecular weight (Mw) and dispersity (Mw/Mn) of the polymer (R1) were measured by GPC, the results were: Mw=30,300, Mw/Mn=1.51.

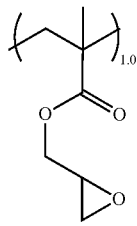

(R1)

[Comparative Synthesis Example 2] Synthesis of Comparative Polymer (R2)

Under a nitrogen atmosphere, 62.8 g of the monomer (B5), 37.2 g of the monomer (B6), 1.45 g of V-601, and 340 g of PGMEA were measured and charged into a 1-L flask. Subsequently, degassing was performed while stirring the mixture to prepare a monomeric polymerization initiator solution. 60 g of PGMEA was measured and charged into a different 1-L flask having a nitrogen atmosphere. After degassing while stirring, the resultant was heated until the inner temperature reached 80° C. The monomeric polymerization initiator solution was added thereto dropwise over 4 hours. Subsequently, the polymer solution was stirred for 16 hours while maintaining the temperature at 80° C., and then was cooled to room temperature. The obtained polymer solution was added dropwise to 1,500 g of vigorously stirred hexane, and the deposited polymer was collected by filtration. Furthermore, the obtained polymer was washed twice with 600 g of hexane. After that, the polymer was vacuum dried at 50° C. for 20 hours to obtain a polymer (R2) in white powder form (yield: 97.5 g, 96%). When the weight-average molecular weight (Mw) and dispersity (Mw/Mn) of the polymer (R2) were measured by GPC, the results were: Mw=33,500, Mw/Mn=1.88.

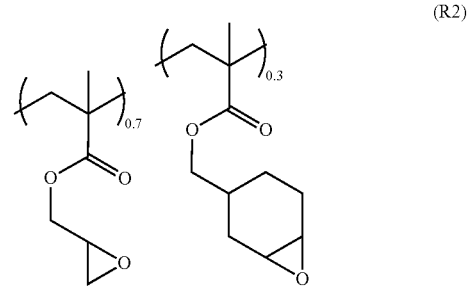

(R2)

[Comparative Synthesis Example 3] Synthesis of Comparative Polymer (R3)

Under a nitrogen atmosphere, 64.3 g of the monomer (B5), 35.7 g of the monomer (B7), 1.49 g of V-601, and 340 g of PGMEA were measured and charged into a 1-L flask. Subsequently, degassing was performed while stirring the mixture to prepare a monomeric polymerization initiator solution. 60 g of PGMEA was measured and charged into a different 1-L flask having a nitrogen atmosphere. After degassing while stirring, the resultant was heated until the inner temperature reached 80° C. The monomeric polymerization initiator solution was added thereto dropwise over 4 hours. Subsequently, the polymer solution was stirred for 16 hours while maintaining the temperature at 80° C., and then was cooled to room temperature. The obtained polymer solution was added dropwise to 1,500 g of vigorously stirred hexane, and the deposited polymer was collected by filtration. Furthermore, the obtained polymer was washed twice with 600 g of hexane. After that, the polymer was vacuum dried at 50° C. for 20 hours to obtain a polymer (R3) in white powder form (yield: 96.5 g, 95%). When the weight-average molecular weight (Mw) and dispersity (Mw/Mn) of the polymer (R3) were measured by GPC, the results were: Mw=32,200, Mw/Mn=1.80.

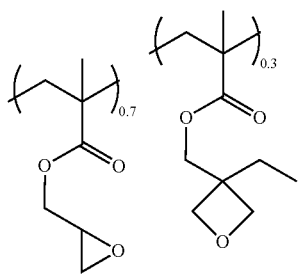

(R3)

[Comparative Synthesis Example 4] Synthesis of Comparative Polymer (R4)

Under a nitrogen atmosphere, 66.1 g of the monomer (B5), 33.9 g of the monomer (B8), 1.49 g of V-601, and 340 g of PGMEA were measured and charged into a 1-L flask. Subsequently, degassing was performed while stirring the mixture to prepare a monomeric polymerization initiator solution. 60 g of PGMEA was measured and charged into a different 1-L flask having a nitrogen atmosphere. After degassing while stirring, the resultant was heated until the inner temperature reached 80° C. The monomeric polymerization initiator solution was added thereto dropwise over 4 hours. Subsequently, the polymer solution was stirred for 16 hours while maintaining the temperature at 80° C., and then was cooled to room temperature. The obtained polymer solution was added dropwise to 1,500 g of vigorously stirred hexane, and the deposited polymer was collected by filtration. Furthermore, the obtained polymer was washed twice with 600 g of hexane. After that, the polymer was vacuum dried at 50° C. for 20 hours to obtain a polymer (R4) in white powder form (yield: 97.0 g, 96%). When the weight-average molecular weight (Mw) and dispersity (Mw/Mn) of the polymer (R4) were measured by GPC, the results were: Mw=31,200, Mw/Mn=1.82.

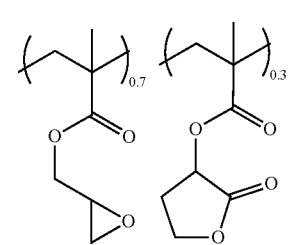

(R4)

[Comparative Synthesis Example 5] Synthesis of Comparative Polymer (R5)

Under a nitrogen atmosphere, 100.0 g of the monomer (B9), 2.21 g of V-601, and 340 g of PGMEA were measured and charged into a 1-L flask. Subsequently, degassing was performed while stirring the mixture to prepare a monomeric polymerization initiator solution. 60 g of PGMEA was measured and charged into a different 1-L flask having a nitrogen atmosphere. After degassing while stirring, the resultant was heated until the inner temperature reached 80° C. The monomeric polymerization initiator solution was added thereto dropwise over 4 hours. Subsequently, the polymer solution was stirred for 16 hours while maintaining the temperature at 80° C., and then was cooled to room temperature. The obtained polymer solution was added dropwise to 1,500 g of vigorously stirred hexane, and the deposited polymer was collected by filtration. Furthermore, the obtained polymer was washed twice with 600 g of hexane. After that, the polymer was vacuum dried at 50° C. for 20 hours to obtain a polymer (R5) in white powder form (yield: 95.2 g, 93%). When the weight-average molecular weight (Mw) and dispersity (Mw/Mn) of the polymer (R5) were measured by GPC, the results were: Mw=33,200, Mw/Mn=1.95.

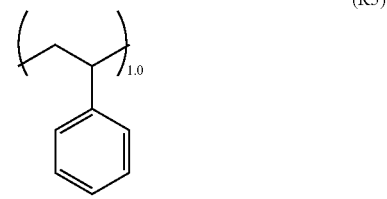

(R5)

Preparation of Materials (AL-1 to -27, Comparative AL-1 to -13) for Forming Adhesive Film For the preparation of materials for forming an adhesive film, the following were used: the polymers (A1) to (A15) and the comparative polymers (R1) to (R5); (AG1) to (AG4) as thermal acid generators; (AG5) as a photo-acid generator; and (X1) to (X3) as crosslinking agents. The compounds were dissolved in an organic solvent containing 0.1 mass % of PF636 (available from OMNOVA) in proportions shown in Table 2. The solution was then filtered through a 0.1-μm filter made of fluorinated resin to prepare materials (AL-1 to -27, comparative AL-1 to -13) for forming an adhesive film.

(AG1)

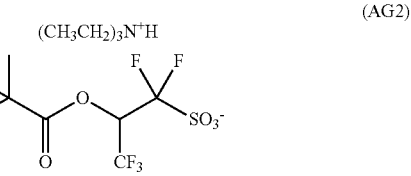

(AG2)

(AG3)

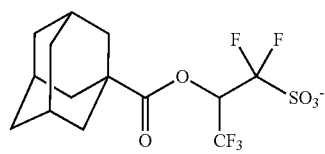

(AG4)

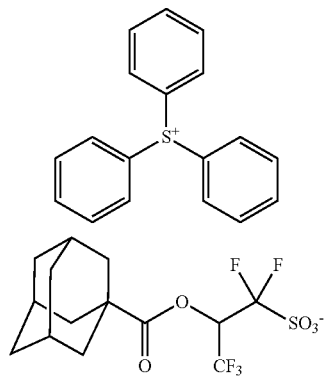
(AG5)

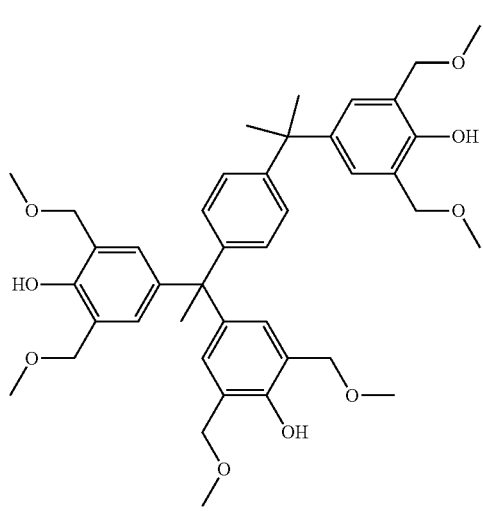
(X1)

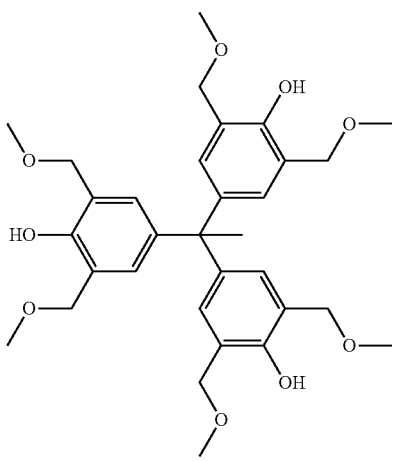
(X2)

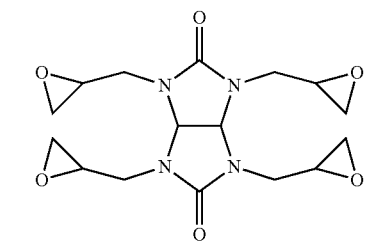
(X3)

TABLE 2

| Material for forming adhesive film | Polymer (parts by mass) | Thermal acid generator (parts by mass) | Photo-acid generator (parts by mass) | Crosslinking agent (parts by mass) | Organic solvent (parts by mass) |
|---|---|---|---|---|---|
| AL-1 | A1(10) | AG1(0.1) | — | — | PGMEA(1760), DAA(440), EL(2200) |
| AL-2 | A2(10) | AG1(0.1) | — | — | PGMEA(1760), DAA(440), EL(2200) |
| AL-3 | A3(10) | AG1(0.1) | — | — | PGMEA(1760), DAA(440), EL(2200) |
| AL-4 | A4(10) | AG1(0.1) | — | — | PGMEA(1760), DAA(440), EL(2200) |
| AL-5 | A5(10) | AG1(0.1) | — | — | PGMEA(1760), DAA(440), EL(2200) |
| AL-6 | A6(10) | AG1(0.1) | — | — | PGMEA(1760), DAA(440), EL(2200) |
| AL-7 | A7(10) | AG1(0.1) | — | — | PGMEA(1760), DAA(440), EL(2200) |
| AL-8 | A8(10) | AG1(0.1) | — | — | PGMEA(1760), DAA(440), EL(2200) |
| AL-9 | A9(10) | AG1(0.1) | — | — | PGMEA(1760), DAA(440), EL(2200) |
| AL-10 | A10(10) | AG1(0.1) | — | — | PGMEA(1760), DAA(440), EL(2200) |
| AL-11 | A11(10) | AG1(0.1) | — | — | PGMEA(1760), DAA(440), EL(2200) |
| AL-12 | A12(10) | AG1(0.1) | — | — | PGMEA(1760), DAA(440), EL(2200) |
| AL-13 | A13(10) | AG1(0.1) | — | — | PGMEA(1760), DAA(440), EL(2200) |
| AL-14 | A14(10) | AG1(0.1) | — | — | PGMEA(1760), DAA(440), EL(2200) |
| AL-15 | A15(10) | AG1(0.1) | — | — | PGMEA(1760), DAA(440), EL(2200) |
| AL-16 | A4(10) | AG1(0.1) | — | — | PGMEA(3960), GBL(440) |
| AL-17 | A4(10) | AG1(0.1) | — | — | PGMEA(3960), DAA(440) |
| AL-18 | A4(10) | AG1(0.1) | — | — | PGMEA(3960), CyH(440) |
| AL-19 | A4(10) | AG1(0.1) | — | — | PGMEA(3960), EL(440) |
| AL-20 | A4(10) | AG1(0.1) | — | — | PGMEA(400), DAA(100), EL(500) |
| AL-21 | A2(10) | AG2(0.1) | — | — | PGMEA(400), DAA(100), EL(500) |
| AL-22 | A2(10) | AG2(0.3) | — | — | PGMEA(400), DAA(100), EL(500) |
| AL-23 | A2(10) | AG3(0.1) | — | — | PGMEA(400), DAA(100), EL(500) |
| AL-24 | A2(10) | AG4(0.1) | — | — | PGMEA(400), DAA(100), EL(500) |
| AL-25 | A2(10) | AG1(0.1) | — | X1(20) | PGMEA(400), DAA(100), EL(500) |
| AL-26 | A2(10) | AG1(0.1) | — | X2(20) | PGMEA(400), DAA(100), EL(500) |
| AL-27 | A2(10) | AG1(0.1) | — | X3(20) | PGMEA(400), DAA(100), EL(500) |
| Comparative AL-1 | A1(10) | — | — | — | PGMEA(1760), DAA(440), EL(2200) |
| Comparative AL-2 | A2(10) | — | — | — | PGMEA(1760), DAA(440), EL(2200) |

TABLE 2-continued

| Material for forming adhesive film | Polymer (parts by mass) | Thermal acid generator (parts by mass) | Photo-acid generator (parts by mass) | Crosslinking agent (parts by mass) | Organic solvent (parts by mass) |
|---|---|---|---|---|---|
| Comparative AL-3 | A3(10) | — | — | — | PGMEA(1760), DAA(440), EL(2200) |
| Comparative AL-4 | A3(10) | — | — | — | PGMEA(1760), DAA(440), EL(2200) |
| Comparative AL-5 | R1(10) | AG1(0.1) | — | — | PGMEA(1760), DAA(440), EL(2200) |
| Comparative AL-6 | R1(10) | AG2(0.1) | — | — | PGMEA(1760), DAA(440), EL(2200) |
| Comparative AL-7 | R1(10) | AG1(0.1) | — | X1(20) | PGMEA(1760), DAA(440), EL(2200) |
| Comparative AL-8 | R1(10) | AG1(0.1) | AG5(1.0) | — | PGMEA(1760), DAA(440), EL(2200) |
| Comparative AL-9 | R2(10) | AG1(0.1) | — | — | PGMEA(1760), DAA(440), EL(2200) |
| Comparative AL-10 | R3(10) | AG1(0.1) | — | — | PGMEA(1760), DAA(440), EL(2200) |
| Comparative AL-11 | R4(10) | AG1(0.1) | — | — | PGMEA(1760), DAA(440), EL(2200) |
| Comparative AL-12 | R1(10) | AG1(0.1) | — | — | PGMEA(400), DAA(100), EL(500) |
| Comparative AL-13 | R5(10) | AG1(0.1) | — | X1(20) | PGMEA(1760), DAA(440), EL(2200) |

The compositions in Table 2 are respectively as follows.
Organic solvent: PGMEA (propylene glycol monomethyl ether acetate)

CyH (cyclohexanone)
DAA (diacetone alcohol)
EL (ethyl lactate)
GBL (γ-butyrolactone)

Example 1: Solvent Resistance Evaluation
(Examples 1-1 to 1-27, Comparative Examples 1-1 to 1-13)

The materials (AL-1 to -27, comparative AL-1 to -13) for forming an adhesive film prepared above were respectively applied onto a silicon substrate and baked at 215° C. for 60 seconds. Then, the film thickness was measured. A PGMEA solvent was dispensed thereon, left to stand for 30 seconds, spin-dried, and baked at 100° C. for 60 seconds to evaporate the PGMEA solvent. The film thickness was then remeasured. Solvent resistance was evaluated by determining the difference between the film thicknesses of before and after the PGMEA treatment. Table 3 shows the results.

TABLE 3

| | Matterial for forming adhesive film | Film thickness after film formation: a (Å) | Film thickness after PGMEA treatment: b (Å) | (b/a) × 100 (%) |
|---|---|---|---|---|
| Example 1-1 | AL-1 | 50.4 | 50.2 | 99.6 |
| Example 1-2 | AL-2 | 50.5 | 50.4 | 99.8 |
| Example 1-3 | AL-3 | 50.5 | 50.4 | 99.8 |
| Example 1-4 | AL-4 | 50.0 | 49.8 | 99.6 |
| Example 1-5 | AL-5 | 50.6 | 50.4 | 99.6 |
| Example 1-6 | AL-6 | 50.2 | 50.0 | 99.6 |
| Example 1-7 | AL-7 | 50.1 | 50.0 | 99.8 |
| Example 1-8 | AL-8 | 50.2 | 50.0 | 99.6 |
| Example 1-9 | AL-9 | 50.7 | 50.5 | 99.6 |
| Example 1-10 | AL-10 | 50.3 | 50.2 | 99.8 |
| Example 1-11 | AL-11 | 50.4 | 50.2 | 99.6 |
| Example 1-12 | AL-12 | 50.2 | 50.0 | 99.6 |
| Example 1-13 | AL-13 | 50.1 | 50.0 | 99.8 |
| Example 1-14 | AL-14 | 50.1 | 49.9 | 99.6 |
| Example 1-15 | AL-15 | 50.3 | 50.2 | 99.8 |
| Example 1-16 | AL-16 | 50.0 | 49.9 | 99.8 |
| Example 1-17 | AL-17 | 50.6 | 50.5 | 99.8 |
| Example 1-18 | AL-18 | 50.1 | 50.0 | 99.8 |
| Example 1-19 | AL-19 | 50.1 | 49.9 | 99.6 |
| Example 1-20 | AL-20 | 204 | 203 | 99.5 |
| Example 1-21 | AL-21 | 203 | 202 | 99.5 |
| Example 1-22 | AL-22 | 207 | 206 | 99.5 |
| Example 1-23 | AL-23 | 202 | 201 | 99.5 |
| Example 1-24 | AL-24 | 202 | 201 | 99.5 |
| Example 1-25 | AL-25 | 203 | 202 | 99.5 |
| Example 1-26 | AL-26 | 204 | 203 | 99.5 |
| Example 1-27 | AL-27 | 204 | 203 | 99.5 |
| Comparative Example 1-1 | Comparative AL-1 | 50.6 | 24.7 | 48.8 |
| Comparative Example 1-2 | Comparative AL-2 | 50.1 | 24.6 | 49.1 |
| Comparative Example 1-3 | Comparative AL-3 | 50.5 | 25.3 | 50.1 |
| Comparative Example 1-4 | Comparative AL-4 | 50.7 | 22.6 | 44.6 |
| Comparative Example 1-5 | Comparative AL-5 | 50.2 | 50.1 | 99.8 |
| Comparative Example 1-6 | Comparative AL-6 | 50.9 | 50.8 | 99.8 |
| Comparative Example 1-7 | Comparative AL-7 | 50.5 | 50.3 | 99.6 |
| Comparative Example 1-8 | Comparative AL-8 | 50.3 | 50.2 | 99.8 |

TABLE 3-continued

|  | Matterial for forming adhesive film | Film thickness after film formation: a (Å) | Film thickness after PGMEA treatment: b (Å) | (b/a) × 100 (%) |
|---|---|---|---|---|
| Comparative Example 1-9 | Comparative AL-9 | 50.6 | 50.4 | 99.6 |
| Comparative Example 1-10 | Comparative AL-10 | 50.7 | 50.5 | 99.6 |
| Comparative Example 1-11 | Comparative AL-11 | 50.2 | 50.0 | 99.6 |
| Comparative Example 1-12 | Comparative AL-12 | 205 | 204 | 99.5 |
| Comparative Example 1-13 | Comparative AL-13 | 50.1 | 49.9 | 99.6 |

As shown in Table 3, in Examples 1-1 to 1-27, where the inventive materials (AL-1 to -27) for forming an adhesive film were used, and Comparative Examples 1-5 to 1-13, there was hardly any reduction in film thickness due to treatment with a solvent, and it can be observed that a film having favorable solvent resistance was obtained. On the other hand, in Comparative Examples 1-1 to 1-4, where no thermal acid generator and no crosslinking agent were contained, it can be observed that sufficient solvent resistance was not achieved.

Example 2: Adhesiveness Test (Examples 2-1 to 2-27, Comparative Examples 2-1 to 2-9)

The materials (AL-1 to -27, comparative AL-5 to -13) for forming an adhesive film were respectively applied onto an $SiO_2$ wafer substrate and baked at 215° C. for 60 seconds in the atmosphere by using a hot plate. Thus, an adhesive film with a film thickness of 5 nm (AL-1 to -19, comparative AL-5 to -11, -13) or 20 nm (AL-20 to -27, comparative AL-12) was formed. This wafer with an adhesive film was cut into a 1×1 cm square, and an aluminum pin with epoxy adhesive was fastened to the cut wafer with a dedicated jig. Thereafter, the assembly was heated with an oven at 150° C. for 1 hour to bond the aluminum pin to the substrate. After cooling to room temperature, initial adhesiveness was evaluated based on the resistance force by a thin-film adhesion strength measurement apparatus (Sebastian Five-A).

FIG. 2 shows an explanatory diagram of an adhesiveness measurement method. In FIG. 2, reference number 8 denotes a silicon wafer (substrate), 9 denotes a cured film, 10 denotes an aluminum pin with adhesive, 11 denotes a support, 12 denotes a grip, and 13 denotes a tensile direction. The adhesion is an average of 12 measurement points, and a larger value indicates that the adhesive film has higher adhesiveness with respect to the substrate. The adhesiveness was evaluated by comparing the obtained values. Table 4 shows the results.

TABLE 4

|  | Material for forming adhesive film | Adhesion (mN) |
|---|---|---|
| Example 2-1 | AL-1 | 550 |
| Example 2-2 | AL-2 | 580 |
| Example 2-3 | AL-3 | 610 |
| Example 2-4 | AL-4 | 520 |
| Example 2-5 | AL-5 | 540 |
| Example 2-6 | AL-6 | 570 |
| Example 2-7 | AL-7 | 600 |
| Example 2-8 | AL-8 | 620 |
| Example 2-9 | AL-9 | 630 |
| Example 2-10 | AL-10 | 590 |
| Example 2-11 | AL-11 | 600 |
| Example 2-12 | AL-12 | 480 |

TABLE 4-continued

|  | Material for forming adhesive film | Adhesion (mN) |
|---|---|---|
| Example 2-13 | AL-13 | 490 |
| Example 2-14 | AL-14 | 470 |
| Example 2-15 | AL-15 | 480 |
| Example 2-16 | AL-16 | 490 |
| Example 2-17 | AL-17 | 500 |
| Example 2-18 | AL-18 | 510 |
| Example 2-19 | AL-19 | 530 |
| Example 2-20 | AL-20 | 540 |
| Example 2-21 | AL-21 | 640 |
| Example 2-22 | AL-22 | 650 |
| Example 2-23 | AL-23 | 600 |
| Example 2-24 | AL-24 | 590 |
| Example 2-25 | AL-25 | 620 |
| Example-2-26 | AL-26 | 580 |
| Example 2-27 | AL-27 | 600 |
| Comparative Example 2-1 | Comparative AL-5 | 600 |
| Comparative Example 2-2 | Comparative AL-6 | 590 |
| Comparative Example 2-3 | Comparative AL-7 | 580 |
| Comparative Example 2-4 | Comparative AL-8 | 590 |
| Comparative Example 2-5 | Comparative AL-9 | 600 |
| Comparative Example 2-6 | Comparative AL-10 | 580 |
| Comparative Example 2-7 | Comparative AL-11 | 450 |
| Comparative Example 2-8 | Comparative AL-12 | 590 |
| Comparative Example 2-9 | Comparative AL-13 | 320 |

As shown in Table 4, it was observed that adhesion was excellent in Examples 2-1 to 2-27, where the inventive materials (AL-1 to -27) for forming an adhesive film were used. It can also be seen that adhesiveness was also favorable in Comparative Examples 2-1 to 2-8, where a polymer containing a structural unit shown by the general formula (2) was used. On the other hand, in Comparative Example 2-9, where a polymer containing no structural unit shown by the general formula (2) was used, adhesiveness was poor compared with the other examples.

Example 3: Patterning Test by ArF Immersion Exposure Using Positive Resist (Examples 3-1 to 3-27, Comparative Examples 3-1 to 3-8)

Spin-on carbon ODL-301 (carbon content: 88 mass %) available from Shin-Etsu Chemical Co., Ltd. was applied to silicon wafer substrates and the resulting substrates were baked at 350° C. for 60 seconds to form a 200-nm thick resist underlayer film. A CVD-SiON hard mask middle layer film was formed thereon, and furthermore, each of the materials (AL-1 to -27, comparative AL-5 to -12) for forming an adhesive film was respectively applied and baked at 215° C. for 60 seconds to form a 5-nm thick (AL-1 to -19, comparative AL-5 to -11) or 20-nm thick (AL-20 to -27, comparative AL-12) adhesive film. A monolayer resist for ArF of a positive resist upper layer film material shown in Table 5 was applied thereon and baked at 105° C. for 60 seconds to form a resist upper layer film having a film thickness of 100 nm. A liquid immersion top coat material (TC-1) was applied on the resist upper layer film and baked at 90° C. for 60 seconds to form a top coat having a film thickness of 50 nm.

The positive resist upper layer film material (monolayer resist for ArF) was prepared by: dissolving a polymer (PRP-A1), an acid generator (PAG1), and a basic compound (Amine1) into a solvent containing 0.1 mass % of FC-430 (available from Sumitomo 3M Ltd.) in proportions shown in Table 5; and filtering the solution through a 0.1-μm filter made of a fluorinated resin.

TABLE 5

| | Polymer (parts by mass) | Acid generator (parts by mass) | Basic compound (parts by mass) | Solvent (parts by mass) |
|---|---|---|---|---|
| Monolayer resist for ArF | PRP-A1 (100) | PAG1 (6.6) | Amine1 (0.8) | PGMEA (2500) |

Polymer for resist: PRP-A1
Molecular weight (Mw)=8,600
Dispersity (Mw/Mn)=1.88

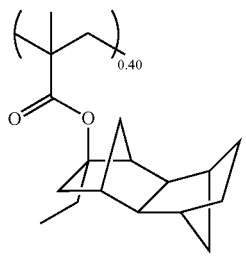
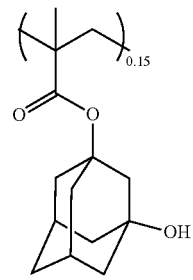
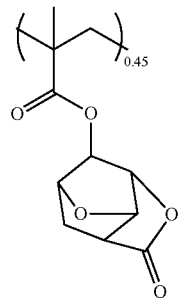

Acid generator: PAG1

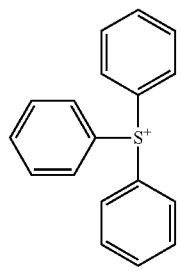

Basic compound: Amine1

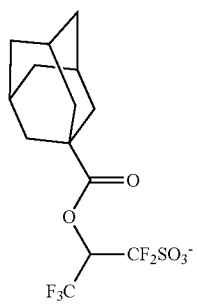

The liquid immersion top coat material (TC-1) was prepared by: dissolving a top coat polymer (PP1) into organic solvents in proportions shown in Table 6; and filtering the solution through a 0.1-μm filter made of a fluorinated resin.

TABLE 6

| | Top coat polymer (parts by mass) | Organic solvent (parts by mass) |
|---|---|---|
| TC-1 | PP1 (100) | Diisoamyl ether (2700) 2-methyl-1-butanol (270) |

Top coat polymer: PP1
Molecular weight (Mw)=8,800
Dispersity (Mw/Mn)=1.69

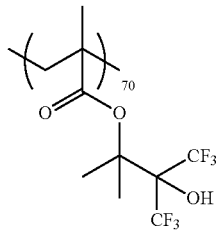

-continued

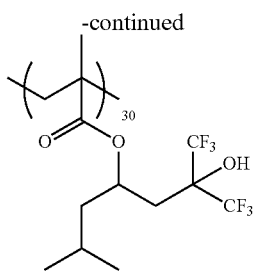

Next, the resulting substrate was exposed to light with an ArF liquid immersion exposure apparatus (NSR-S610C manufactured by Nikon Corporation, NA: 1.30, σ: 0.98/0.65, 35° s-polarized dipole illumination, 6% halftone phase shift mask), baked (PEB) at 100° C. for 60 seconds, and developed with a 2.38 mass % aqueous solution of tetramethylammonium hydroxide (TMAH) for 30 seconds. Thus, a 40-nm 1:1 line-and-space pattern was obtained. Regarding this pattern, the sectional profile and roughness were observed with an electron microscope. The collapse limit (nm) was a minimum width of the lines which could be resolved without collapse when the line width was reduced by increasing the exposure dose. A smaller value indicates higher and better collapse resistance.

The cross-sectional profile of the obtained pattern was evaluated with an electron microscope (S-4700) manufactured by Hitachi, Ltd. and the pattern roughness was evaluated with an electron microscope (CG4000) manufactured by Hitachi High-Technologies Corp. Table 7 shows the results.

TABLE 7

| | Material for forming adhesive film | Pattern sectional profile after development | Pattern roughness (nm) | Collapse limit (nm) |
|---|---|---|---|---|
| Example 3-1 | AL-1 | Vertical profile | 1.8 | 35 |
| Example 3-2 | AL-2 | Vertical profile | 1.7 | 33 |
| Example 3-3 | AL-3 | Vertical profile | 1.7 | 32 |
| Example 3-4 | AL-4 | Vertical profile | 1.6 | 35 |
| Example 3-5 | AL-5 | Vertical profile | 1.6 | 34 |
| Example 3-6 | AL-6 | Vertical profile | 1.7 | 36 |
| Example 3-7 | AL-7 | Vertical profile | 1.8 | 32 |
| Example 3-8 | AL-8 | Vertical profile | 1.7 | 31 |
| Example 3-9 | AL-9 | Vertical profile | 1.7 | 32 |
| Example 3-10 | AL-10 | Vertical profile | 1.8 | 34 |
| Example 3-11 | AL-11 | Vertical profile | 1.8 | 33 |
| Example 3-12 | AL-12 | Vertical profile | 1.8 | 37 |
| Example 3-13 | AL-13 | Vertical profile | 1.7 | 36 |
| Example 3-14 | AL-14 | Vertical profile | 1.9 | 37 |
| Example 3-15 | AL-15 | Vertical profile | 1.7 | 37 |
| Example 3-16 | AL-16 | Vertical profile | 1.7 | 34 |
| Example 3-17 | AL-17 | Vertical profile | 1.7 | 35 |
| Example 3-18 | AL-18 | Vertical profile | 1.8 | 35 |
| Example 3-19 | AL-19 | Vertical profile | 1.7 | 35 |
| Example 3-20 | AL-20 | Vertical profile | 1.8 | 34 |
| Example 3-21 | AL-21 | Vertical profile | 1.7 | 31 |
| Example 3-22 | AL-22 | Vertical profile | 1.7 | 31 |
| Example 3-23 | AL-23 | Vertical profile | 1.7 | 33 |
| Example 3-24 | AL-24 | Vertical profile | 1.8 | 34 |
| Example 3-25 | AL-25 | Vertical profile | 1.7 | 32 |
| Example 3-26 | AL-26 | Vertical profile | 1.7 | 35 |
| Example 3-27 | AL-27 | Vertical profile | 1.8 | 34 |
| Comparative Example 3-1 | Comparative AL-5 | Trailing profile | 2.3 | 34 |
| Comparative Example 3-2 | Comparative AL-6 | Trailing profile | 2.2 | 36 |
| Comparative Example 3-3 | Comparative AL-7 | Trailing profile | 2.1 | 35 |
| Comparative Example 3-4 | Comparative AL-8 | Inversely tapered profile | 2.6 | 36 |
| Comparative Example 3-5 | Comparative AL-9 | Trailing profile | 2.1 | 36 |
| Comparative Example 3-6 | Comparative AL-10 | Trailing profile | 1.8 | 34 |
| Comparative Example 3-7 | Comparative AL-11 | Trailing profile | 2.1 | 32 |
| Comparative Example 3-8 | Comparative AL-12 | Trailing profile | 2.2 | 35 |

As shown in Table 7, it can be observed that better collapse suppression performance was exhibited and that the pattern profile was also a vertical profile in Examples 3-1 to 3-27, where the inventive materials (AL-1 to -27) for forming an adhesive film were used, compared with the Comparative Examples. Meanwhile, although high adhesion and excellent collapse suppression performance were also achieved in Comparative Examples 3-1 to 3-8, where the resins contained in the inventive materials for forming an adhesive film were not contained, the pattern had a trailing profile or an inversely tapered profile. Thus, it can be observed that Examples 3-1 to 3-27, where the inventive materials for forming an adhesive film were used, were better regarding pattern formation ability. In Comparative Example 3-4, where the polymer did not have a photo-acid generator moiety but a photo-acid generator (AG5) was added separately, it can be seen that the pattern had an inversely tapered profile, and moreover, the pattern roughness was degraded.

Example 4: Patterning Test by ArF Immersion Exposure Using Negative Resist (Examples 4-1 to 4-27, Comparative Examples 4-1 to 4-8)

In the same manner as in the patterning test where a positive resist was used, an organic underlayer film and a CVD-SiON hard mask middle layer film were formed on silicon wafers, and an adhesive film was further formed thereon. A monolayer resist for ArF of a negative resist upper layer film material shown in Table 8 was applied thereon and baked at 100° C. for 60 seconds to form a photoresist layer having a film thickness of 100 nm. A liquid immersion top coat material (TC-1) was applied on the photoresist film and baked at 90° C. for 60 seconds to form a top coat having a film thickness of 50 nm.

The negative resist upper layer film material was prepared by: dissolving the polymer (PRP-A1), an acid generator (PAG1), and a basic compound (Amine1) into a solvent containing 0.1 mass % FC-430 (available from Sumitomo 3M Ltd.) in proportions shown in Table 8; and filtering the solution through a 0.1-μm filter made of a fluorinated resin.

TABLE 8

| | Polymer (parts by mass) | Acid generator (parts by mass) | Basic compound (parts by mass) | Solvent (parts by mass) |
|---|---|---|---|---|
| Negative resist upper layer film material | PRP-A1 (100) | PAG1 (7.0) | Amine1 (1.0) | PGMEA (2500) |

Next, the resulting substrate was exposed to light with an ArF liquid immersion exposure apparatus (NSR-S610C manufactured by Nikon Corporation, NA: 1.30, a: 0.98/0.65, 35° s-polarized dipole illumination, 6% halftone phase shift mask) and baked (PEB) at 100° C. for 60 seconds. With a rotation of 30 rpm, a developer of butyl acetate was discharged from a developer nozzle for 3 seconds. Then the rotation was stopped to perform puddle-development for 27 seconds, spin-drying was performed after rinsing with diisoamyl ether, and baking was performed at 100° C. for 20 seconds to evaporate the rinse solvent. A negative line-and-space pattern of 43 nm was obtained by this patterning. Regarding this pattern, the sectional profile was observed with an electron microscope. The collapse limit (nm) was a minimum width of the lines which could be resolved without collapse when the line width was reduced by decreasing the exposure dose. A smaller value indicates higher and better collapse resistance.

The cross-sectional profile of the obtained pattern was evaluated with an electron microscope (S-4700) manufactured by Hitachi, Ltd. and the pattern collapse after development was evaluated with an electron microscope (CG4000) manufactured by Hitachi High-Technologies Corp. Table 9 shows the results.

TABLE 9

| | Material for forming adhesive film | Pattern sectional profile after development | Collapse limit (nm) |
|---|---|---|---|
| Example 4-1 | AL-1 | Vertical profile | 31 |
| Example 4-2 | AL-2 | Vertical profile | 30 |
| Example 4-3 | AL-3 | Vertical profile | 28 |
| Example 4-4 | AL-4 | Vertical profile | 33 |
| Example 4-5 | AL-5 | Vertical profile | 32 |
| Example 4-6 | AL-6 | Vertical profile | 31 |
| Example 4-7 | AL-7 | Vertical profile | 29 |
| Example 4-8 | AL-8 | Vertical profile | 28 |
| Example 4-9 | AL-9 | Vertical profile | 29 |
| Example 4-10 | AL-10 | Vertical profile | 31 |
| Example 4-11 | AL-11 | Vertical profile | 29 |
| Example 4-12 | AL-12 | Vertical profile | 33 |
| Example 4-13 | AL-13 | Vertical profile | 32 |
| Example 4-14 | AL-14 | Vertical profile | 34 |
| Example 4-15 | AL-15 | Vertical profile | 33 |
| Example 4-16 | AL-16 | Vertical profile | 31 |
| Example 4-17 | AL-17 | Vertical profile | 31 |
| Example 4-18 | AL-18 | Vertical profile | 32 |
| Example 4-19 | AL-19 | Vertical profile | 30 |
| Example 4-20 | AL-20 | Vertical profile | 30 |
| Example 4-21 | AL-21 | Vertical profile | 28 |
| Example 4-22 | AL-22 | Vertical profile | 28 |
| Example 4-23 | AL-23 | Vertical profile | 29 |
| Example 4-24 | AL-24 | Vertical profile | 29 |
| Example 4-25 | AL-25 | Vertical profile | 28 |
| Example 4-26 | AL-26 | Vertical profile | 31 |
| Example 4-27 | AL-27 | Vertical profile | 30 |
| Comparative Example 4-1 | Comparative AL-5 | Vertical profile | 36 |
| Comparative Example 4-2 | Comparative AL-6 | Vertical profile | 37 |
| Comparative Example 4-3 | Comparative AL-7 | Vertical profile | 35 |
| Comparative Example 4-4 | Comparative AL-8 | Vertical profile | 34 |
| Comparative Example 4-5 | Comparative AL-9 | Vertical profile | 35 |
| Comparative Example 4-6 | Comparative AL-10 | Vertical profile | 34 |
| Comparative Example 4-7 | Comparative AL-11 | Vertical profile | 33 |
| Comparative Example 4-8 | Comparative AL-12 | Vertical profile | 36 |

As shown in Table 9, a pattern with a vertical profile was obtained in every example in the patterning test using a negative resist. In Examples 4-1 to 4-27, where the inventive materials (AL-1 to -27) for forming an adhesive film were used, the value of the collapse limit was smaller than when a positive resist was used in each case, and it can be observed that better adhesiveness was provided in the negative resist. Meanwhile, high adhesion and excellent collapse suppression performance were also provided in Comparative Examples 4-1 to 4-8, where the resins contained in the inventive materials for forming an adhesive film were not contained. However, the collapse limit was smaller in Examples 4-1 to 4-27, where the inventive materials for forming an adhesive film were used, and it can be observed that adhesiveness was better in the Examples.

Example 5: Electron Beam Patterning Test
(Example 5-1, Comparative Example 5-1

The materials (AL-4, comparative AL-5) for forming an adhesive film were respectively applied to silicon wafer substrates and baked at 215° C. for 60 seconds to form a 5-nm thick adhesive film. A metal-containing resist composition of a resist upper layer film material was applied thereon and baked at 180° C. for 60 seconds to form a 60-nm thick resist upper layer film.

The resist upper layer film material (metal-containing resist composition) was prepared by: dissolving a titanium-containing compound (AM-1) and a metal salt sensitizer (S-1) into 4-methyl-2-pentanol (MIBC) containing 0.1 mass % of FC-4430 (available from Sumitomo 3M Ltd.) in proportions shown in Table 10; and filtering the solution through a 0.1-μm filter made of a fluorinated resin.

TABLE 10

| | Titanium-containing compound (parts by mass) | Metal salt sensitizer (parts by mass) | Organic solvent (parts by mass) |
|---|---|---|---|
| Metal-containing resist composition | AM-1 (100) | S-1 (1) | MIBC (2000) |

Synthesis of Titanium-Containing Compound (AM-1)

To a solution of 284 g of titanium tetraisopropoxide (available from Tokyo Chemical Industry Co., Ltd.) in 500 g of 2-propanol (IPA), a solution of 27 g of deionized water in 500 g of IPA was dropped in while stirring at room temperature over 2 hours. To the obtained solution, 180 g of 2,4-dimethyl-2,4-octanediol was added, and this was stirred at room temperature for 30 minutes. This solution was concentrated at 30° C. under reduced pressure, then was further heated to 60° C., and kept heated under reduced pressure until a distillate was no longer obtained. When the distillate was no longer observed, 1,200 g of 4-methyl-2-pentanol (MIBC) was added, and this was heated at 40° C. under reduced pressure until the IPA distillate was no longer obtained to afford 1,000 g (compound concentration: 25 mass %) of a solution of a titanium-containing compound AM-1 in MIBC. The molecular weight of the solution was measured in terms of polystyrene to find that Mw=1,200.

Metal Salt Sensitizer: S-1

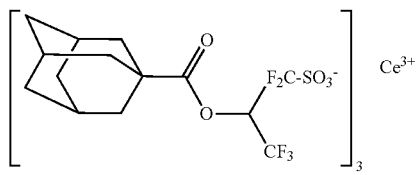

Next, drawing was performed in a vacuum chamber at an acceleration voltage of 50 kV by using JBX-9000MV (manufactured by JEOL Ltd.). Immediately after drawing, baking (PEB) was performed at 200° C. for 60 seconds, puddle-development was performed with butyl acetate for 20 seconds to obtain a negative pattern.

The obtained resist patterns were evaluated as follows. The exposure dose to resolve a 100-nm line-and-space (LS) by 1:1 was defined as the sensitivity. The collapse limit (nm) was defined as a minimum width of the lines which could be resolved without collapse at the above exposure dose. A smaller value indicates higher and better collapse resistance. Table 11 shows the results.

TABLE 11

| | Material for forming adhesive film | Collapse limit (nm) |
|---|---|---|
| Example 5-1 | AL-4 | 55 |
| Comparative Example 5-1 | Comparative AL-5 | 65 |

As shown in Table 11, the collapse limit was smaller in Example 5-1, where the inventive material (AL-4) for forming an adhesive film was used, than in Comparative Example 5-1, where the adhesive material of the present invention was not used, and it can be observed that the present invention also has excellent adhesiveness in a metal-containing resist.

From the above, the inventive materials for forming an adhesive film have high adhesiveness to a resist upper layer film and have an effect of suppressing fine pattern collapse, and are therefore extremely useful as adhesive film materials to be used in multilayer resist methods. In addition, according to the inventive patterning processes using these materials, a fine pattern can be formed in a substrate to be processed with high precision.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A material for forming an adhesive film used for an adhesive film formed directly under a resist upper layer film, the material for forming an adhesive film comprising: (A) a resin having at least one structural unit containing a fluorine-substituted organic sulfonyl anion structure and having at least two structural units shown by the following general formula (2) besides the structural unit containing the fluorine-substituted organic sulfonyl anion structure; (B) a thermal acid generator; and (C) an organic solvent,

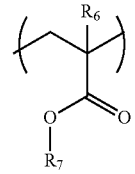

(2)

wherein $R_6$ represents a hydrogen atom or a methyl group and $R_7$ represents a group selected from the following formulae (2-1) to (2-3),

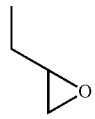

(2-1)

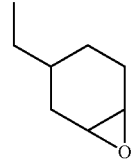

(2-2)

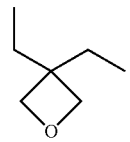

(2-3)

wherein a broken line represents an attachment point.

2. The material for forming an adhesive film according to claim 1, wherein the fluorine-substituted organic sulfonyl anion structure is a structure shown by the following general formula (1),

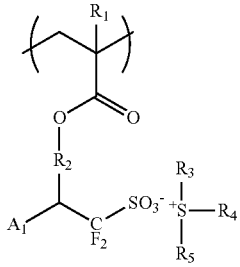

(1)

wherein $R_1$ represents a hydrogen atom or a methyl group, $R_2$ represents a single bond, $-Z^{21}-C(=O)-O-$, $-Z^{21}-O-$, or $-Z^{21}-O-C(=O)-$, $Z^{21}$ represents a saturated hydrocarbylene group having 1 to 12 carbon atoms and optionally containing a carbonyl group, an ester bond, or an ether bond, $R_3$ to $R_5$ each independently represent a hydrocarbyl group having 1 to 21 carbon atoms and optionally containing a heteroatom, any two of $R_3$, $R_4$, and $R_5$ optionally bonding with each other to form a ring together with a sulfur atom bonded therewith, and $A_1$ represents a hydrogen atom or a trifluoromethyl group.

3. The material for forming an adhesive film according to claim 2, wherein the $R_2$ in the general formula (1) contains a divalent organic group having an alicyclic structure.

4. The material for forming an adhesive film according to claim 1, wherein the organic solvent (C) is a mixture of one or more kinds of organic solvent having a boiling point of lower than 150° C. and one or more kinds of organic solvent having a boiling point of 150° C. or higher and lower than 220° C.

5. The material for forming an adhesive film according to claim 1, wherein the resin (A) has a weight-average molecular weight of 5,000 to 70,000.

6. The material for forming an adhesive film according to claim 1, further comprising at least one out of (D) a photo-acid generator, (E) a surfactant, (F) a crosslinking agent, and (G) a plasticizer.

7. The material for forming an adhesive film according to claim 1, wherein the resist upper layer film has been formed using a negative resist composition.

8. The material for forming an adhesive film according to claim 1, wherein the resist upper layer film has been formed using a resist upper layer film material containing at least an organic metal compound and a solvent.

9. The material for forming an adhesive film according to claim 8, wherein the organic metal compound contains at least one selected from titanium, cobalt, copper, zinc, zirconium, lead, indium, tin, antimony, and hafnium.

10. A patterning process for forming a pattern in a substrate to be processed, comprising the steps of:
(I-1) applying the material for forming an adhesive film according to claim 1 on the substrate to be processed and then performing a heat treatment to form an adhesive film;
(I-2) forming a resist upper layer film on the adhesive film by using a photoresist material;
(I-3) subjecting the resist upper layer film to pattern exposure and then to development with a developer to form a circuit pattern in the resist upper layer film;
(I-4) transferring the pattern to the adhesive film by dry etching while using the resist upper layer film having the formed circuit pattern as a mask; and
(I-5) forming the pattern in the substrate to be processed by processing the substrate to be processed while using the adhesive film having the transferred pattern as a mask.

11. A patterning process for forming a pattern in a substrate to be processed, comprising the steps of:
(II-1) forming a resist underlayer film on the substrate to be processed;
(II-2) forming a silicon-containing resist middle layer film on the resist underlayer film;
(II-3) applying the material for forming an adhesive film according to claim 1 on the silicon-containing resist middle layer film and then performing a heat treatment to form an adhesive film;
(II-4) forming a resist upper layer film on the adhesive film by using a photoresist material;
(II-5) subjecting the resist upper layer film to pattern exposure and then to development with a developer to form a circuit pattern in the resist upper layer film;
(II-6) transferring the pattern to the adhesive film by dry etching while using the resist upper layer film having the formed circuit pattern as a mask;
(II-7) transferring the pattern to the silicon-containing resist middle layer film by dry etching while using the adhesive film having the formed pattern as a mask;
(II-8) transferring the pattern to the resist underlayer film by dry etching while using the silicon-containing resist middle layer film having the transferred pattern as a mask; and
(II-9) forming the pattern in the substrate to be processed by processing the substrate to be processed while using the resist underlayer film having the transferred pattern as a mask.

12. A patterning process for forming a pattern in a substrate to be processed, comprising the steps of:
(III-1) forming a resist underlayer film on the substrate to be processed;
(III-2) forming an inorganic hard mask middle layer film selected from a silicon oxide film, a silicon nitride film, and a silicon oxynitride film on the resist underlayer film;
(III-3) applying the material for forming an adhesive film according to claim 1 on the inorganic hard mask middle layer film and then performing a heat treatment to form an adhesive film;
(III-4) forming a resist upper layer film on the adhesive film by using a photoresist material;
(III-5) subjecting the resist upper layer film to pattern exposure and then to development with a developer to form a circuit pattern in the resist upper layer film;
(III-6) transferring the pattern to the adhesive film by dry etching while using the resist upper layer film having the formed circuit pattern as a mask;
(III-7) transferring the pattern to the inorganic hard mask middle layer film by dry etching while using the adhesive film having the formed pattern as a mask;
(III-8) transferring the pattern to the resist underlayer film by dry etching while using the inorganic hard mask middle layer film having the transferred pattern as a mask; and
(III-9) forming the pattern in the substrate to be processed by processing the substrate to be processed while using the resist underlayer film having the transferred pattern as a mask.

13. The patterning process according to claim 12, wherein the inorganic hard mask middle layer film is formed by a CVD method or an ALD method.

14. The patterning process according to claim 10, wherein photolithography at a wavelength of 10 nm or more to 300 nm or less, a direct drawing by electron beam, a nanoimprinting, or a combination thereof is employed as a method for forming the circuit pattern in the resist upper layer film.

15. The patterning process according to claim 10, wherein alkaline development or development with an organic solvent is employed as a development method.

16. The patterning process according to claim 10, wherein the substrate to be processed is a semiconductor device substrate or the semiconductor device substrate coated with any of a metal film, a metal carbide film, a metal oxide film, a metal nitride film, a metal oxycarbide film, and a metal oxynitride film.

17. A patterning process according to claim 16, wherein as the metal, silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof is used.

18. A method for forming an adhesive film that functions as an adhesive layer employed in a semiconductor device manufacturing process, the method comprising:
spin-coating a substrate to be processed with the material for forming an adhesive film according to claim 1; and heating the substrate coated with the material for forming an adhesive film at a temperature of 100° C. or higher to 300° C. or lower for 10 to 600 seconds to form a cured film.

19. A method for forming an adhesive film that functions as an adhesive layer employed in a semiconductor device manufacturing process, the method comprising:

spin-coating a substrate to be processed with the material for forming an adhesive film according to claim 1; and heating the substrate coated with the material for forming an adhesive film in an atmosphere having an oxygen concentration of 0.1% or more to 21% or less to form a cured film.

20. A method for forming an adhesive film that functions as an adhesive layer employed in a semiconductor device manufacturing process, the method comprising:

spin-coating a substrate to be processed with the material for forming an adhesive film according to claim 1; and heating the substrate coated with the material for forming an adhesive film in an atmosphere having an oxygen concentration of less than 0.1% to form a cured film.

\* \* \* \* \*